United States Patent
Buyuktosunoglu et al.

(10) Patent No.: US 9,569,402 B2
(45) Date of Patent: *Feb. 14, 2017

(54) 3-D STACKED MULTIPROCESSOR STRUCTURE WITH VERTICALLY ALIGNED IDENTICAL LAYOUT OPERATING PROCESSORS IN INDEPENDENT MODE OR IN SHARING MODE RUNNING FASTER COMPONENTS

(75) Inventors: Alper Buyuktosunoglu, White Plains, NY (US); Philip G. Emma, Danbury, CT (US); Allan M. Hartstein, Chappaqua, NY (US); Michael B. Healy, White Plains, NY (US); Krishnan Kunjunny Kailas, Tarrytown, NY (US)

(73) Assignee: International Business Machines Corporation, Armonk, NY (US)

( * ) Notice: Subject to any disclaimer, the term of this patent is extended or adjusted under 35 U.S.C. 154(b) by 1040 days.

This patent is subject to a terminal disclaimer.

(21) Appl. No.: 13/452,078

(22) Filed: Apr. 20, 2012

(65) Prior Publication Data
US 2013/0283008 A1    Oct. 24, 2013

(51) Int. Cl.
*G06F 15/76* (2006.01)
*G06F 15/78* (2006.01)
*H01L 25/065* (2006.01)

(52) U.S. Cl.
CPC ....... *G06F 15/7867* (2013.01); *H01L 25/0657* (2013.01); *H01L 2924/0002* (2013.01); *Y02B 60/1207* (2013.01); *Y02B 60/1225* (2013.01)

(58) Field of Classification Search
CPC .................................................. G06F 15/7867
See application file for complete search history.

(56) References Cited

U.S. PATENT DOCUMENTS

| 5,420,754 | A | 5/1995 | Segelken et al. |
| 5,568,574 | A | 10/1996 | Tanguay, Jr. et al. |

(Continued)

OTHER PUBLICATIONS

R. Kumar et al., "Interconnections in Multi-Core Architectures: Understanding Mechanisms, Overheads and Scaling," IEEE 32nd Annual International Symposium on Computer Architecture (ISCA), Jun. 2005, 37 pages.

(Continued)

*Primary Examiner* — Jacob A Petranek
(74) *Attorney, Agent, or Firm* — Jennifer R. Davis; Ryan, Mason & Lewis, LLP

(57) ABSTRACT

Three-dimensional (3-D) processor structures are provided which are constructed by connecting processors in a stacked configuration. For example, a processor system includes a first processor chip comprising a first processor, and a second processor chip comprising a second processor. The first and second processor chips are connected in a stacked configuration with the first and second processors connected through vertical connections between the first and second processor chips. The processor system further includes a mode control circuit to selectively configure the first and second processors of the first and second processor chips to operate in one of a plurality of operating modes, wherein the processors can be selectively configured to operate independently, to aggregate resources, to share resources, and/or be combined to form a single processor image.

16 Claims, 15 Drawing Sheets

(56) References Cited

U.S. PATENT DOCUMENTS

| | | |
|---|---|---|
| 5,701,233 A | 12/1997 | Carson et al. |
| 5,731,945 A | 3/1998 | Bertin et al. |
| 6,174,494 B1 | 1/2001 | Lowden et al. |
| 6,525,726 B1 | 2/2003 | Xie et al. |
| 7,068,515 B2 | 6/2006 | Harris et al. |
| 7,232,708 B2 | 6/2007 | Morkner |
| 7,465,608 B1 | 12/2008 | Farrar |
| 7,554,203 B2 | 6/2009 | Zhou et al. |
| 7,615,857 B1 | 11/2009 | Jouppi |
| 7,675,181 B2 | 3/2010 | Lee |
| 7,723,853 B2 | 5/2010 | Pan et al. |
| 2005/0248021 A1* | 11/2005 | Morkner ................ 257/686 |
| 2007/0165457 A1 | 7/2007 | Kim |
| 2007/0257350 A1 | 11/2007 | Lee et al. |
| 2010/0115171 A1 | 5/2010 | Tsunoda et al. |
| 2010/0117217 A1 | 5/2010 | Park et al. |
| 2011/0012181 A1 | 1/2011 | Hashimoto et al. |
| 2011/0078412 A1 | 3/2011 | Emma et al. |
| 2011/0084404 A1* | 4/2011 | Yoko ................ G11C 5/063 257/777 |
| 2012/0098140 A1 | 4/2012 | Bartley et al. |
| 2012/0166763 A1 | 6/2012 | Henry et al. |
| 2013/0055185 A1* | 2/2013 | Bose et al. ................ 716/120 |
| 2013/0321074 A1 | 12/2013 | Ko et al. |

OTHER PUBLICATIONS

H. Homayoun et al., "Dynamically Heterogeneous Cores Through 3D Resource Pooling," 18th International Symposium on High Performance Computer Architecture, Feb. 25-29, 2012, 12 pages.

\* cited by examiner

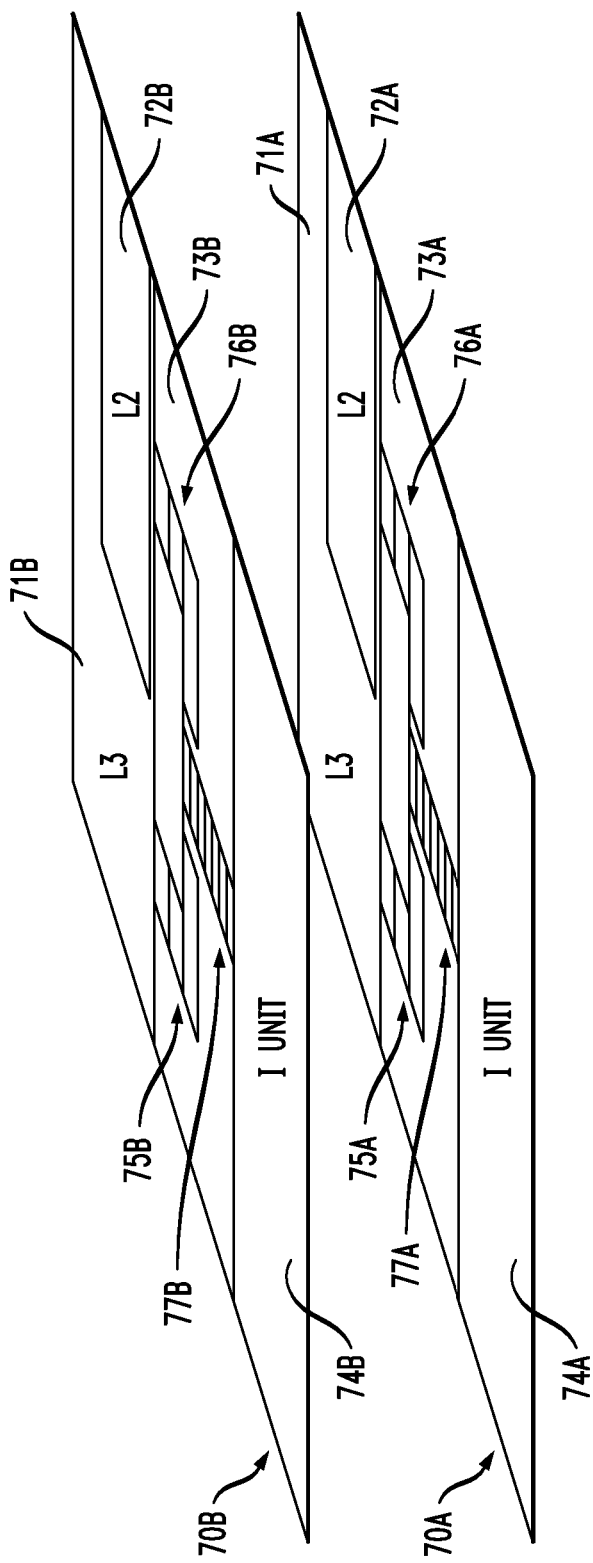

90

90

90

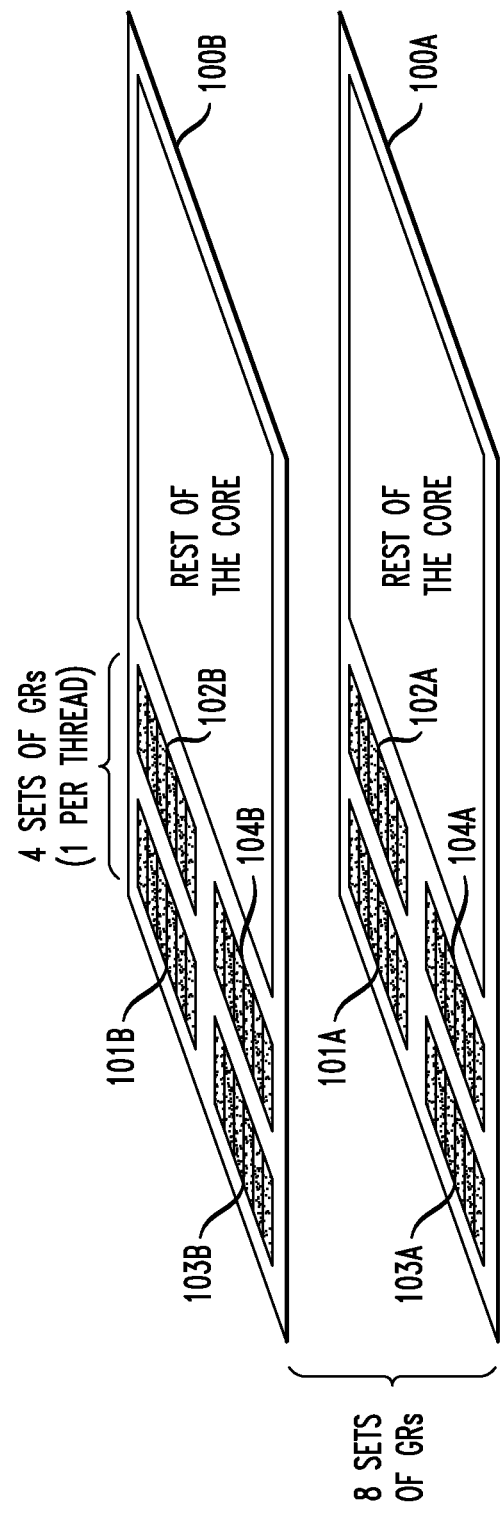

130

140

160

180

3-D STACKED MULTIPROCESSOR STRUCTURE WITH VERTICALLY ALIGNED IDENTICAL LAYOUT OPERATING PROCESSORS IN INDEPENDENT MODE OR IN SHARING MODE RUNNING FASTER COMPONENTS

TECHNICAL FIELD

The field relates generally to three-dimensional (3-D) multiprocessor devices that are formed by connecting processors in a stacked configuration, and methods for controlling 3-D stacked multiprocessor devices to selectively operate in one of a plurality of operating modes.

BACKGROUND

In the field of semiconductor processor chip fabrication, single-chip processors were fabricated by many companies during the early stages of processor technology. In the last decade or so, as Moore's Law has continued to shrink dimensions, many companies and other entities have designed processor chips with multiple processors on a single layer. However, as the number of processors per chip continues to increase, on chip communication between processors becomes problematic. For example, as the 2D size of the processor chip increases to accommodate more processors, the length of the horizontal wiring between the processors increases (in the range of mm or cm) resulting in cycle delays in the communication between processors, and requiring the use of high-powered on-chip drivers along communication paths between processors. Furthermore, the cycle delay with respect to communication between processors increases as the operating frequency increases.

SUMMARY OF THE INVENTION

Exemplary embodiments of the invention generally include three-dimensional (3-D) processor devices that are formed by connecting processors in a stacked configuration, and methods for controlling 3-D stacked multiprocessor devices to selectively operate in one of a plurality of operating modes.

In one exemplary embodiment of the invention, a processor system includes a first processor chip comprising a first processor, and a second processor chip comprising a second processor. The first and second processor chips are connected in a stacked configuration with the first and second processors connected through vertical connections between the first and second processor chips. The processor system further includes a mode control circuit to selectively configure the first and second processors of the first and second processor chips to operate in one of a plurality of operating modes.

In one exemplary mode of operation, the first and second processor chips are both active, and a microarchitecture of the first processor of the first processor chip is configured by aggregating elements from both the first and second processors, and a microarchitecture of the second processor of the second processor chip is configured by aggregating elements from both the first and second processors. The aggregated elements may be portions of execution units of the first and second processors, caches, or register sets, for example.

In another exemplary mode of operation, the first processor chip is active and the second processor chip is inactive, and a microarchitecture of the first processor of the active first processor chip is augmented by utilizing a portion of the second processor of the inactive second processor chip. The microarchitecture of the first processor may be augmented by utilizing a portion of an execution unit of the second processor of the inactive second processor chip. The microarchitecture of the first processor may be augmented by combining a cache of the first processor with a cache of the second processor of the inactive second processor chip. The first processor of the active first processor chip may operate at increased power in a turbo mode while utilizing the portion of the second processor of the inactive second processor chip.

In yet another exemplary mode of operation, the first and second processor chips share a processor interconnect structure.

In another exemplary mode of operation, the first and second processor chips are both active, and the first and second processors are configured to operate as a single processor and aggregate their threads to increase an amount of threads that are usable by the first and second processors.

In another exemplary mode of operation, where the first and second processors have an identical layout of subsystem regions, the first and second processors are configured to operate as a single processor by combining faster ones of corresponding subsystem regions of the first and second processors and by turning off slower ones of corresponding subsystem regions of the first and second processors.

In another exemplary embodiment of the invention, a semiconductor package includes a package substrate, and a processor system comprising a plurality of 3-D stacked processor chips mounted on the package substrate. Each 3-D stacked processor chip includes a first processor chip having a first processor, and a second processor chip having a second processor. The first and second processor chips are connected in a stacked configuration with the first and second processors connected through vertical connections between the first and second processor chips. The semiconductor package further includes a mode control circuit to selectively configure the first and second processors of the first and second processor chips in each of the 3-D stacked processor chips to operate in one of a plurality of operating modes.

In yet another exemplary embodiment of the invention, a method is provided for operating a computer processor which includes a first processor chip having a first processor and a second processor chip having a second processor, wherein the first and second processor chips are connected in a stacked configuration with the first and second processors connected through vertical connections between the first and second processor chips. The method includes generating a first control signal to operate the computer processor in a first mode wherein the first and second processors are configured to aggregate or share resources, and generating a second control signal to operate the computer processor in a second mode wherein both the first and second processors operate independently.

These and other exemplary embodiments, features, objects and advantages of the present invention will become apparent from the following detailed description of illustrative embodiments thereof, which is to be read in connection with the accompanying drawings.

BRIEF DESCRIPTION OF THE DRAWINGS

FIG. 8 is a schematic perspective view of a 3-D stacked multiprocessor device comprising a pair of processors having identical processor layouts as depicted in FIG. 7, according to an exemplary embodiment of the invention.

FIG. 10 is a schematic perspective view of a 3-D stacked multiprocessor device according to yet another exemplary embodiment of the invention.

DETAILED DESCRIPTION OF EXEMPLARY EMBODIMENTS

Exemplary embodiments of the invention will now be described in further detail with regard to 3-D multiprocessor devices that are formed by connecting processors in a stacked configuration, and methods for controlling 3-D stacked multiprocessor devices to selectively operate in one of multiple resource aggregating and sharing modes.

Figure 1:
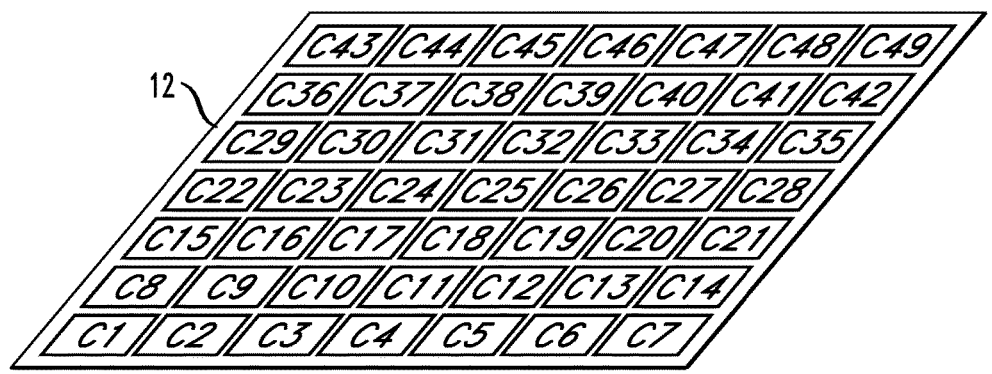
FIG. 1 is a schematic perspective view of a multiprocessor chip.

FIG. 1 is a schematic perspective view of a multiprocessor chip to which principles of the invention may be applied. In particular, FIG. 1 schematically illustrates a multiprocessor chip 10 comprising a semiconductor die 12 having a plurality of processors C1, C2, . . . , C49 (generally denoted Cn) formed on the die 12. The processors Cn are arranged in a "planar" system, wherein each processor Cn has its own dedicated footprint in a 2-D space. The processors Cn may be connected to each other in the 2-D plane using horizontal wiring and electrical interconnects that are formed as part of the BEOL (back end of line) structure of the chip 10, as is readily understood by those of ordinary skill in the art.

In a planar system as shown in FIG. 1, as the number of processors increases, communication between processors becomes problematic. For example, as the 2D size of chip increases to accommodate more processors, the length of the horizontal wiring between the processors increases (in the range of mm or cm) resulting in cycle delays in the communication paths between processors. This cycle delay requires the use of high-powered on-chip drivers along the communication paths between processors. Furthermore, this cycle delay also increases with increasing operating frequency.

Principles of the invention utilize chip-stacking techniques to form 3-D stacked multiprocessor structures using multiple layers of processor chips wherein two or more processor chips are integrated into a single stacked system having a single-chip "footprint" (i.e., the stacked processor chips appear to be a single chip). The term "processor chip" as used herein refers to any semiconductor chip or die having one or more processors. The term "multiprocessor chip" as used herein refers to any semiconductor chip or die having two or more processors. In general, in a 3-D stacked structure, two or more chip layers includes processors that are aligned and interconnected using short vertical interconnects such that processors in one layer are aligned and vertically connected to corresponding processors in another layer. It is to be understood that when two different processors or processor components/elements on different processor chip layers are said to be "aligned" with each other, the term "aligned' means, for example, that the two different processors or processor component/elements at least partially overlap or fully overlap each other on the different layers. In this regard, two processors or components/elements of processors on different layers of processor chips can be fully aligned in that the processors or components are in the same 2D positions of each plane within a 3D stack of processor chips. Alternatively, the processors or components/elements of processors may be substantially aligned but with some offset between the 2D positions of each plane within the 3D stack of processor chips.

Figure 2:
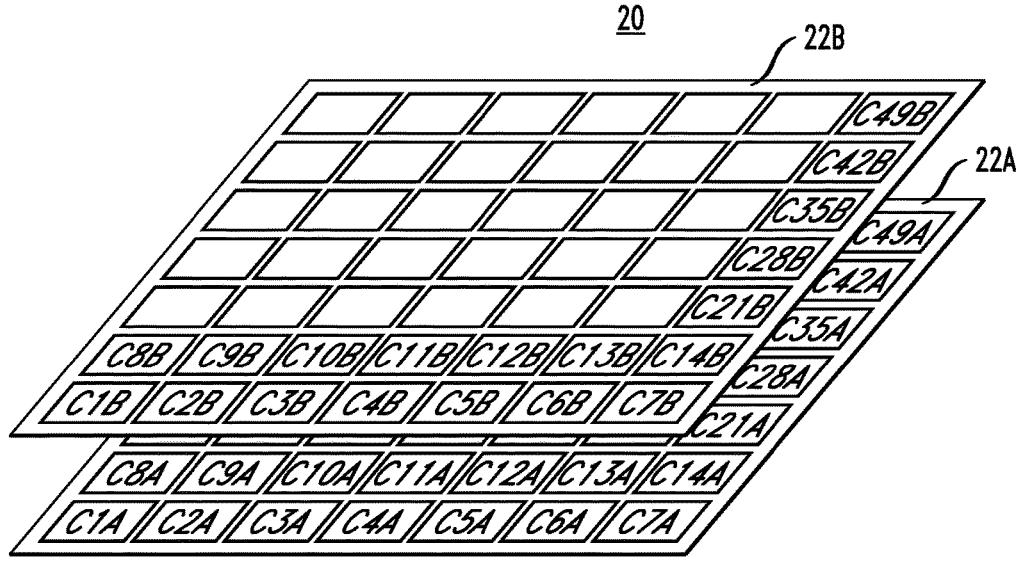
FIG. 2 is a schematic perspective view of a 3-D stacked multiprocessor structure according to an exemplary embodiment of the invention.

For example, FIG. 2 is a schematic perspective view of a 3-D stacked multiprocessor structure according to an exemplary embodiment of the invention. In particular, FIG. 2 schematically illustrates a 3-D stacked multiprocessor chip 20 comprising a first multiprocessor chip 22A and a second multiprocessor chip 22B vertically stacked on top of the first multiprocessor chip 22A. In the exemplary embodiment of FIG. 2, the multiprocessor chips 22A and 22B are substantially the same (identical in component structure, but may vary in interconnect structure), and are depicted as having 49 integrated processors, similar to the multiprocessor chip 10 depicted in FIG. 1. In particular, the first multiprocessor chip 22A comprises a plurality of processors C1A, C2A, . . . , C49A and the second multiprocessor chip 22B comprises a plurality of processors C1B, C2B . . . , C49B. The first and second multiprocessor chips 22A and 22B are vertically stacked on one another and connected to each other such that pairs of processors C1A/C1B, C2A/C2B, . . . , C49A/C49B (generally, CnA/CnB) are aligned and connected to each other using vertical interconnects.

With the exemplary structure depicted in FIG. 2, each aligned processor stack CnA/CnB comprises a plurality of vertically connected processors that commonly share the same I/O connections. These I/O connections are multiplexed internally such that at each processor location in 2D space, the plurality of vertically stacked (and connected) processors CnA/CnB logically appear (to other stacked processors) to operate and function as a single processor. Principles of the invention can be extended to include a plurality of 3-D stacked processor chips (such as shown in FIG. 2) packaged together on a package substrate. These principles will now be discussed in further detail with reference to FIGS. 3, 4, and 5.

Figure 3:
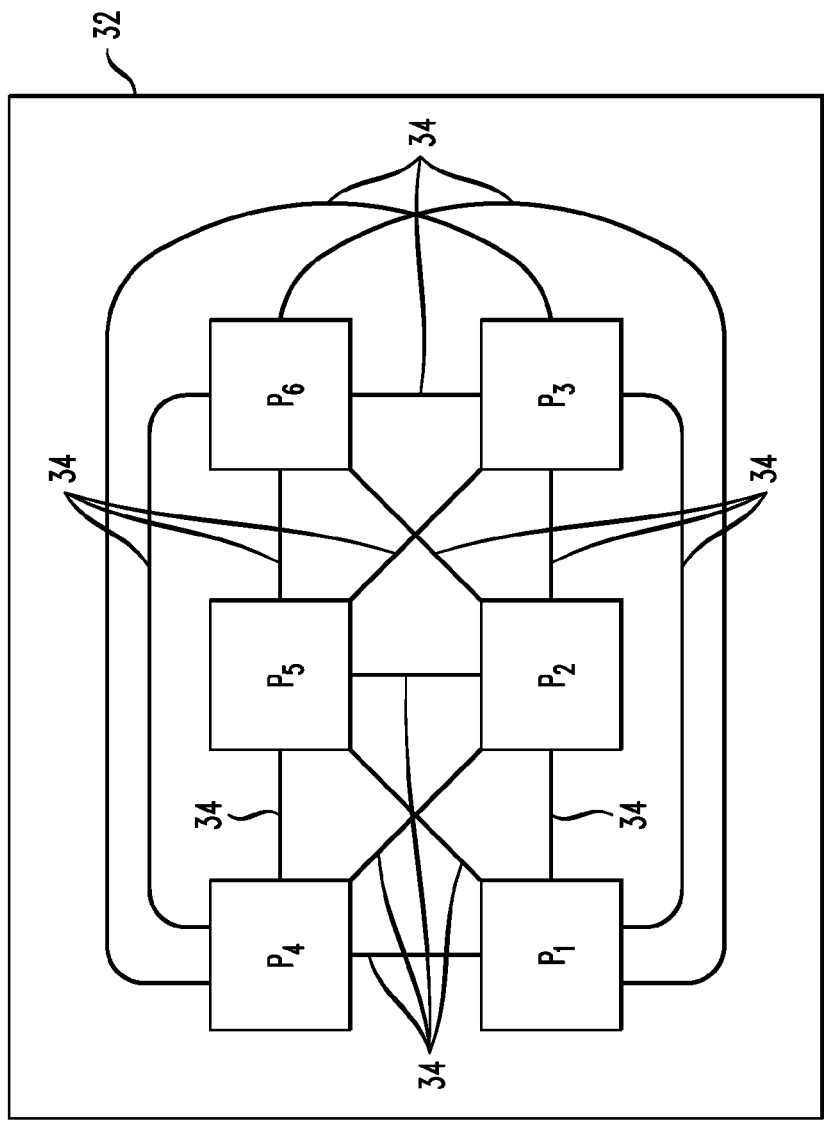
FIG. 3 is a schematic view of a chip package structure.

FIG. 3 is a schematic view of a chip package structure to which principles of the invention may be applied. In particular, FIG. 3 depicts a processor system 30 comprising a package substrate 32 and a plurality of processor chips P1, P2, P3, P4, P5 and P6 mounted on the package substrate 32. The package substrate 32 comprises a plurality of electrical interconnects and traces that form electrical wiring 34 which provides an all-to-all connection between the processor chips P1, P2, P3, P4, P5 and P6. Each of the processor chips P1, P2, P3, P4, P5, and P6 are identical and may be multiprocessor chips each having a plurality of processors.

Figure 4:
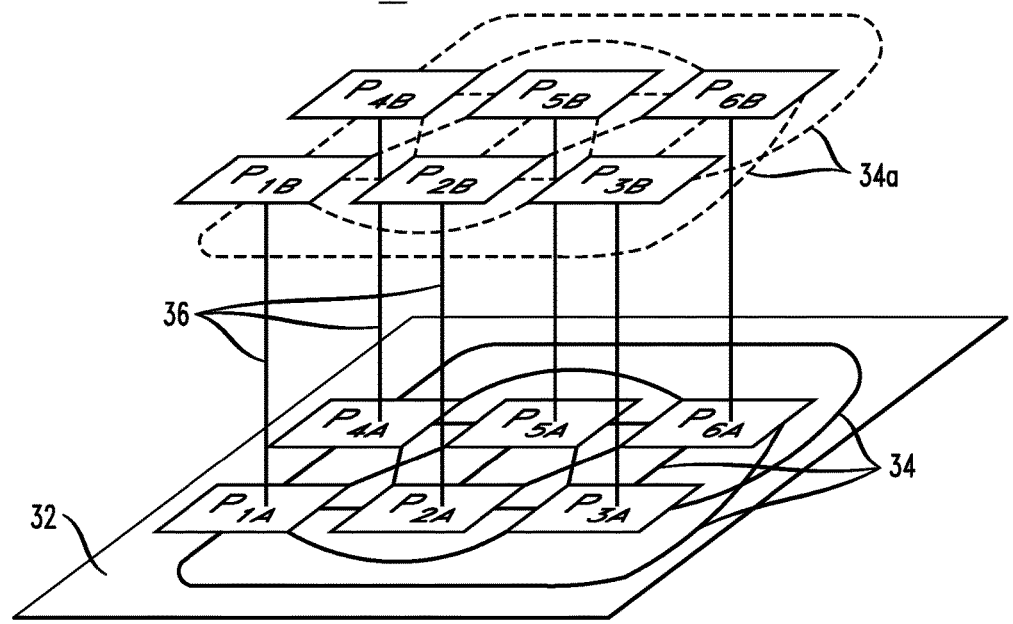
FIG. 4 conceptually illustrates a 3-D stacked multiprocessor structure according to another exemplary embodiment of the invention.
Figure 5:
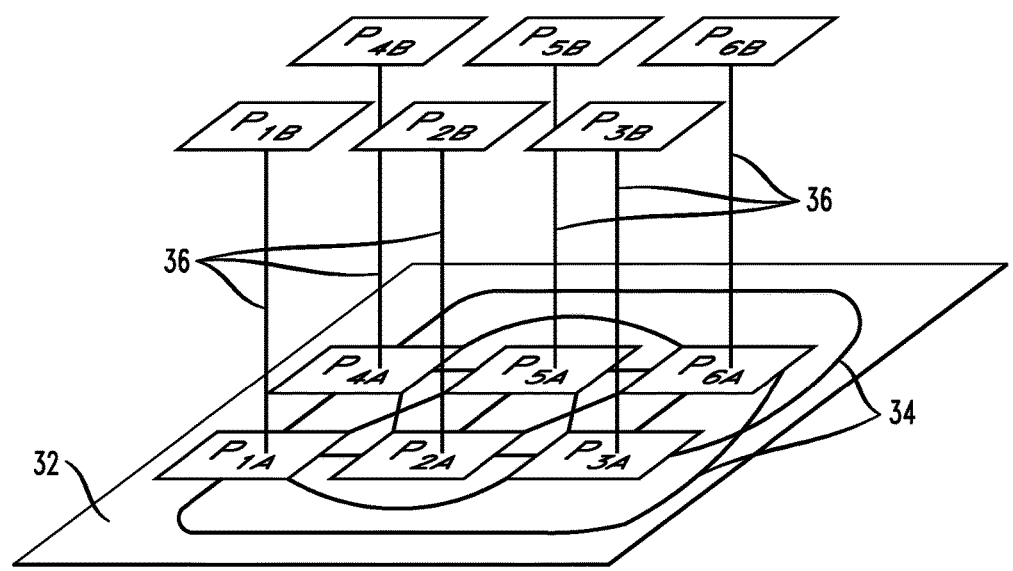
FIG. 5 schematically illustrates a physical implementation of a 3-D stacked multiprocessor structure, which is based on the conceptual implementation shown in FIG. 4, according to another exemplary embodiment of the invention.

FIGS. 4 and 5 schematically illustrate a 3-D stacked processor system according to another exemplary embodiment of the invention. In particular, FIG. 4 is a conceptual view of an exemplary 3-D stacked multiprocessor package structure 40. Similar to the package structure 30 depicted in FIG. 3, the 3-D stacked multiprocessor package structure 40 of FIG. 4 comprises a package substrate 32 and a plurality of first layer processor chips P1A, P2A, P3A, P4A, P5A and P6A mounted on the package substrate 32. The package substrate 32 comprises a plurality of electrical interconnects and traces that form electrical wiring 34 which provides an all-to-all connection between the processor chips P1A, P2A, P3A, P4A, P5A and P6A. Each of the processor chips P1A, P2A, P3A, P4A, P5A and P6A are identical and may be multiprocessor chips each having a plurality of processors.

As further shown in FIG. 4, a plurality of second layer processor chips P1B, P2B, P3B, P4B, P5B and P6B are vertically disposed and mounted on corresponding first layer processor chips P1A, P2A, P3A, P4A, P5A and P6A using short vertical connections 36. The second layer of processor chips P1B, P2B, P3B, P4B, P5B and P6B are identical to the corresponding first layer of processor chips P1A, P2A, P3A, P4A, P5A and P6A, and may be multiprocessor chips each having a plurality of processors. FIG. 4 depicts a plurality of dotted lines 34a that represent virtual all-to-all wiring between the processor chips P1B, P2B, P3B, P4B, P5B and P6B in the second package layer of chips. These virtual wires 34a do not physically exist, but rather represent that the second layer processor chips P1B, P2B, P3B, P4B, P5B and P6B are connected to each other and can communicate using the same physical wiring 34 that is formed on the package substrate 32.

FIG. 5 schematically illustrates a physical implementation of a 3-D stacked multiprocessor structure 50, which is based on the conceptual implementation shown in FIG. 4, according to another exemplary embodiment of the invention. As depicted in FIG. 5, the only wiring that physically exists in the 3-D stacked multiprocessor package structure 50 is the wiring 34 that is formed on the package substrate 32 and the short vertical interconnects 36 that are formed between the corresponding processor chip stacks P1A/P1B, P2A/P2B, P3A/P3B, P4A/P4B, P5A/P5B and P6A/P6B. In the 3-D stacked multiprocessor package structure 50 of FIG. 5, the processor chips within a given vertical stack P1A/P1B, P2A/P2B, P3A/P3B, P4A/P4B, P5A/P5B and P6A/P6B will communicate with each other using the vertical connections 36 that are formed between processor chips (and these vertical connections 36 include connections that are formed between corresponding aligned processors in different processor chip layers).

In accordance with exemplary embodiments of the invention, two processor chips can be conjoined using known semiconductor fabrication techniques wherein two identical processor chips can be bonded together "face-to-back" or "face-to-face". In a face-to-back configuration, the active surface (face) of a first processor chip is bonded to the non-active surface (back) of a second processor chip, wherein the processors and other corresponding elements of the two processor chips are aligned. With this structure, vertical wiring (e.g., conductive vias) can be formed in the active surface of the first processor chip and exposed as a first array of contact pads on the active surface of the first processor chip, and vertical wiring (e.g., through-silicon-vias) can be formed through the back side of the second processor chip and exposed as a second array of contact pads on the non-active surface of the second processor chip. The first and second array of contact pads can be soldered together when the first and second processor chips are conjoined face-to-back, thereby forming the short vertical connections between the aligned processor elements. To shorten the length of the vertical connections, the back side of the second processor chip can be ground down using known techniques; to make the die thinner.

In a "face-to-face" configuration, wherein two identical processor chips (identical in function) that are mirror images of each other are bonded such that the active surface (face) of a first processor chip is bonded to the active surface (face) of a second processor chip, with the processors and other elements of the two chips aligned. With this structure, vertical wiring (e.g., conductive vias) can be formed in the active surface of the first processor chip and exposed as a first array of contact pads on the active surface of the first processor chip, and vertical wiring can be formed in the active surface of the second processor chip and exposed as a second array of contact pads on the active surface of the second processor chip. The first and second array of contact pads can be soldered together when the first and second processor chips are conjoined face-to-face, thereby forming short vertical connections between the aligned processor elements.

With 3-D stacked processor systems, two or more processors that are approximately (or literally) co-located in their planar space, but lying on different layers, can operate independently or collaboratively by aggregating and/or sharing resources to augment functionality and to push operating thresholds, reliability, and performance further than what would be practical to do in a planar system where each chip has its own space on a 2-dimensional package. Various methods for controlling 3-D stacked multiprocessors to selectively operate in one or more multiple resource aggregating and/or sharing modes will be discussed in further detail below with reference to FIGS. 6~18. In general, exemplary methods for selectively controlling 3-D stacked multiprocessors enable a group of stacked processors to operate concurrently, yet independently of each other for certain applications. For other application as discussed below, two or more vertically stacked processors can be controlled to selectively operate in a collaborative fashion by sharing or aggregating resources (e.g., threads, execution units, caches, etc.) across the various layers, using the short vertical connections between the processor layers as fast communication paths, to provide enhanced operation.

Figure 6:
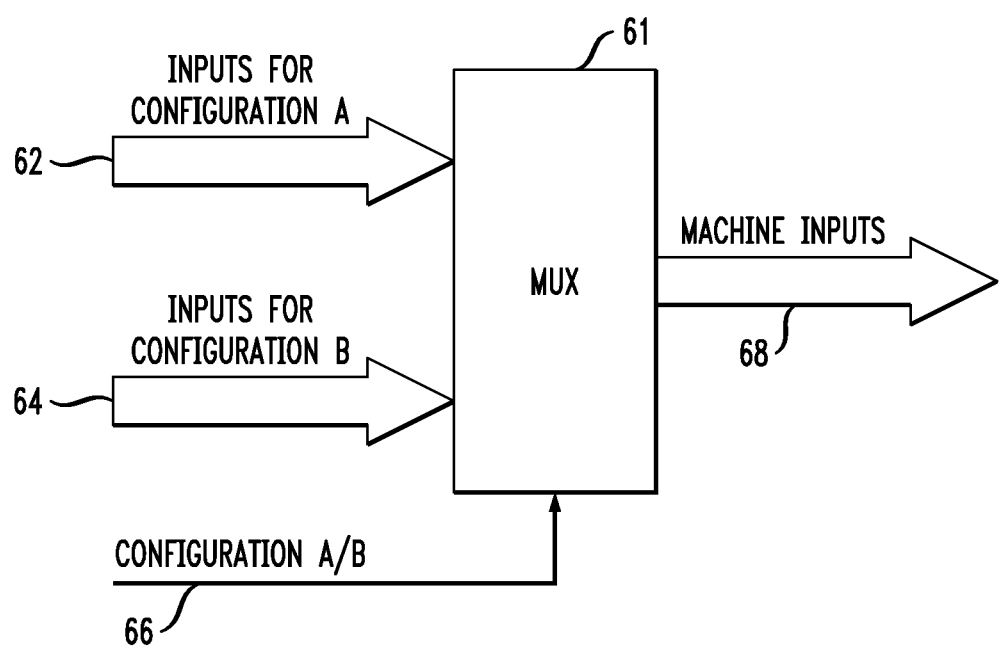
FIG. 6 schematically illustrates a method for controlling multimodal operation of a 3-D stacked multiprocessor structure, according to an exemplary embodiment of the invention.

In accordance with exemplary embodiments of the invention, control schemes are employed to control multimodal operation of two or more vertically stacked processors, so that the processors within a vertical stack can be selectively controlled to operate independently or in a collaborative manner. For example, FIG. 6 schematically illustrates a method for controlling the multimodal operation of a 3-D stacked multiprocessor structure according to an exemplary embodiment of the invention. In particular, a control scheme 60 as shown in FIG. 6 includes a multiplexer 61 that selectively receives as input a plurality of configuration parameter sets 62 and 64 and a configuration mode control signal 66. The different sets of configuration parameters A and B are selectively output as machine inputs 68 to a given vertical stack of processors, wherein the machine inputs configure the processor stack to operate in one of a plurality of different operating modes as specified by the machine inputs 68. Although two sets of input configuration parameters A and B are shown for ease of illustration, three or more different sets of configuration parameters can be input and selectively output by the multiplexer 61. It is to be understood that the control scheme of FIG. 6 is a system that is local to one processor stack, and that each processor stack in a given processor system will have a corresponding control circuit as shown in FIG. 6.

The control system 60 of FIG. 6 can be controlled by global control system, such as a service processor, that scans in the control information and outputs a configuration control signal 66 to each multiplexer 61 in the processor system to configure the processor stacks in a given manner. The machine inputs 68 that are output from each multiplexer 61 to a corresponding processor stack can be further multiplexed and/or decoded using circuitry that is internal (on-chip) to the vertically stacked processors to control various I/O ports (to be shared or bypassed) and other switches that may be employed to control sharing and/or aggregating of resources between different layers of processors in a given processor stack.

In various exemplary embodiments of the invention as discussed below, when two or more processors in a vertical stack are spatially coincident, the processors and their components can be synergistically combined in various manners to give a processor-tupled system several new uses to enhance performance. Initially, it is to be noted that because a vertical processor stack places two or more processors (more or less—either exactly or approximately) right on top of each other, as an initial impression, this seems impractical because it doubles the heat associated with any hotspots, which tends to be mostly located in processors. In this regard, exemplary control schemes may be implemented to control the power of a stack of co-located processors by running the stacked processors at a lower power level by modulating the operating voltage and/or the operating frequency, for example, so that the total power (e.g. total power density and/or total power consumption) is manageable.

More specifically, in one exemplary embodiment of the invention, a 3D stacked processor device, which is fabricated by vertically stacking and connecting a plurality of processor chips, can be operated one of a plurality of operating modes to control power the 3D stacked processor device. For example, in a 3D stacked processor device having first and second processor chips, the 3D stacked processor device can be selectively operated in a first mode wherein the first processor chip is turned on and a second processor chip is turned off. In the first mode, each processor of the first processor chip is turned on and may be operating at maximum frequency and full power, with a total power that can be supported by the package structure (e.g., the power density at certain hot spots is controlled so that the heat at a given hot spot in the package is not too excessive for the given package structure.)

In another mode of operation, the 3D stacked processor device can be selectively operated in a second mode wherein both the first and second processor chips are turned on. In this instance, both processor chips can be operating at a maximum frequency and power level with a total power (e.g., power density or power consumption) that can be supported by the package structure. In another instance, in the second mode of operation, each processor of the first and second processor chips can operate at less than full power so that a total power of the 3D stacked processor device is substantially the same as the total power of the 3D stacked processor device when each processor of only the first processor chip or second processor chips operates at full power and/or maximum frequency. In other words, to obtain the same power consumption or power density profile, the processors in each of the processor chip layers can be operated at a lower supply voltage (or lower operating frequency) so that the aggregate power consumption is the same or similar to the first mode where the processors on only one processor chip layer are active.

A power control scheme according to principles of the invention is based on a realization that the power provided to a processor can be reduced by a significant percent (e.g., 50%) while only having to decrease the operating frequency of the processor by a much smaller amount (e.g., 10%). A power control scheme can be used to selectively control the power supply voltage of the processors or by adjusting the frequency of operation, each of which serves to adjust the overall power consumption of a processor chip. Thus, in 3-D stacked processor chip structure having multiple planes of processors, the ability to modulate the power supply voltage, and selectively power-off subsets of processor planes, allows there to be a range of operating modes in the system, including one or more modes in which multiple planes of processors are operated at a lower voltage so as to keep the total power substantially the same as the total power consumed when operating one plane of processors (or by maintaining the same power density at a given hotpot in the 3-D stacked process chip structure when operating multiple planes of processors a one plane of processors).

In a 3-D processor stack, each set of vertically stacked processors use the same set of interconnect signals, on-package as well as off-package, in each power control operating mode. In this regard, since each processor chip layer in a vertical stack shares the same interconnect signals, even when processor chips are operating at a lower frequency (in the second mode), there is less communication requirements (less I/O bandwidth) required. As such, principles of the invention which employ techniques for reusing (multiplexing) the interconnect signals and package I/O signals are motivated by the lower bandwidth requirements generated from each layer in the 3-D stack due to the lower frequency operation as demanded by the constraint to preserve the power consumption constant.

In other exemplary embodiments of the invention, in a processor system comprising two or more layers of stacked processor chips, wherein each processor chip includes one or more processors, wherein processors in different processor chip layers are connected through vertical connections between the different processor chip layers, a mode control circuit (such as shown and described above with reference to FIG. 6) can selectively configure two or more processors in different chip layers to operate in one of a plurality of operating modes. For example, in one operating mode, one or more or all of the processor chips within a given stack can be operated independently, wherein the vertical connections between layers of independently operating processor chips may be used as communication paths between independently operating processor chips within the stack.

In another mode of operation, various components/resources in different layers of processor chips can be aggregated to augment the microarchitecture of one or more processors on different layers of processor chips. As is readily understood by those of ordinary skill in the art, the term "microarchitecture" of a processor refers to the physical (hardware) configuration of a processor. The microarchitecture of a processor includes components such as caches, bus structure (path width), the arrangement and number of execution units, instruction units, arithmetic units, etc. For instance, assume a 3-D stacked processor chip device comprises a first processor chip having a first processor, and a second processor chip having a second processor. In one mode of operation, where the first and second processor chips are both active, a microarchitecture of the first processor of the first processor chip can be configured or augmented by aggregating elements from both the first and second processors, and a microarchitecture of the second processor of the second processor chip can be configured or augmented by aggregating elements from both the first and second processors. In another embodiment, the first processor chip can be active and the second processor chip can be inactive, wherein a microarchitecture of the first processor of the active first processor chip is augmented by utilizing a portion of the second processor of the inactive second processor chip. The aggregated element may be portions of executions units, register sets, caches, etc.

In another exemplary mode of operation, various components/resources in different layers of processor chips can be "shared" between different processors on different layers of processor chips. For instance, as explained below, two different processors on different layers of processor chips can combine their caches (e.g., L1, L2, or L3 caches) to create a cache that is double in size, yet actively shared by the two processors. In this instance, the aggregated (combined) components or resources are shared by the different processors. In yet another exemplary mode of operation, two or more different processors on different layers of processor chips in a given stack can be combined to operate a single processor image. Exemplary embodiments of the invention showing different modes of operation for aggregating and/or sharing and/or combining processor resources will be explained in further detail below with reference to FIGS. 7, 8, 9A, 9B, 9C, 10, 11, 12, 13, 14, 15, 16, 17A, 17B and 18.

Figure 7:
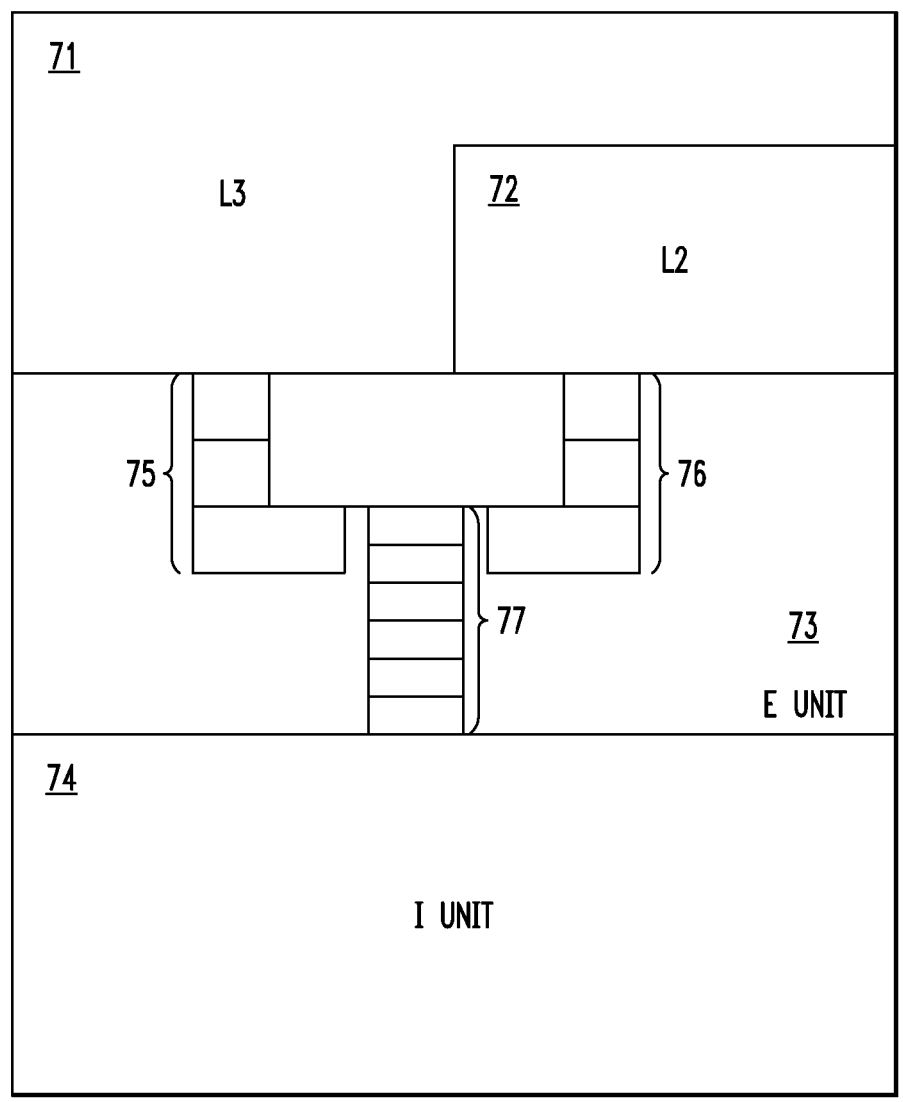
FIG. 7 is a schematic plan view of a processor to which principles of the invention may be applied.

For example, FIGS. 7 and 8 illustrate an exemplary mode of operation for selectively configuring different processors on different layers of processor chips to aggregate and/or share portions of the execution units of the different processor to enhance the execution capabilities of one or more of the different processors. FIG. 7 is a schematic plan view of a processor 70 to which principles of the invention may be applied. FIG. 7 schematically illustrates a microarchitecture of a processor 70, wherein the processor 70 comprises various components such as an L3 cache 71, an L2 cache 72, an execution unit 73 and an instruction unit 74. The execution unit 73 includes a first floating point unit 75 and a second floating point unit 76 (wherein the first and second floating point units 75 and 76 are identical) and a set of floating point registers 77. A 3-D stacked multiprocessor structure such as shown in FIG. 8 can be constructed using a plurality of the processors 70 of FIG. 7.

In particular, FIG. 8 is a schematic perspective view of a 3-D stacked multiprocessor device 80 comprising a first processor 70A and a second processor 70B vertically stacked on top of the first processor 70A. In the exemplary embodiment of FIG. 8, the processors 70A and 70B are identical in structure, and have a processor layout as depicted in FIG. 7. In particular, the first processor 70A comprises an L3 cache 71A an L2 cache 72A, an execution unit 73A and an instruction unit 74A. The execution unit 73A includes a first floating point unit 75A and a second floating point unit 76A (wherein the first and second floating point units 75A and 76A are identical) and a set of floating point registers 77A. Moreover, the second processor 70B comprises an L3 cache 71B an L2 cache 72B, an execution unit 73B and an instruction unit 74B. The execution unit 73B includes a first floating point unit 75B and a second floating point unit 76B (wherein the first and second floating point units 75B and 76B are identical) and a set of floating point registers 77B.

In one exemplary embodiment of the invention, the execution units 73A and 73B of the first and second processors 70A and 70B are aligned to each other and connected to each other using short vertical connections. With this structure, the execution units can be wired vertically so that for the two processors 70A and 70B shown in FIG. 8, the execution unit 73A of the first processor 70A can functionally include one-half of the elements of the execution units 73A/73B of the processor pair, and the execution unit 73B of the second processor 70B can functionally include the other one-half of the elements of the execution units 73A/73B of the processor pair, wherein each pair of halves being is chosen so as to minimize the planar area of each execution unit.

This 3-D aggregation of execution units is advantageous over conventional planar geometries. In a conventional planar system, the execution units of two processors lying in the same plane can be connected such that the output of one execution unit can be input to the second execution unit. However, the "horizontal" electrical interconnect between the execution units of the two processors can be relatively long (e.g., 5 mm-20 mm) such that there may be one or two "dead" cycles in the transmission of the signal between the processors, which results in an undesired delay in the signal transmission. In contrast, in the 3-D stacked processor-onprocessor architecture such as shown in FIG. 8, half of the elements of the execution units on each processor are effectively aggregated into a new execution unit so that the execution unit in each plane is effectively smaller in area. Since the same elements of each processor are spatially co-located, the area of the aggregated components of both processors is achieved by vertically connecting the execution unit elements across the 3-D layers.

For example, in the exemplary embodiment of FIG. 8, assume that each processor 70A and 70B has two identical floating point units 75A/76A and 75B/76B. In the first processor plane 70A, it may take 1-2 cycles of latency to transmit a signal from the output of the first floating-point unit 75A to the input of the second floating-point unit 76A because of the horizontal distance between the floating point units 75A and 76A. If, however, the co-located pair of first floating point units 75A and 75B in both planes are vertically connected, and the co-located pair second floating point units 76A and 76B are vertically connected, then the execution unit 73A of the first processor 70A can utilize the vertically connected pair of first floating point units 75A and 75B, and the execution unit 73B of the second processor 70B can utilize the vertically connected pair of second floating point units 76A and 76B, so that the execution unit of each processor 70A and 70B still has two floating point units.

The vertical connections between the processor elements 75A and 76A and processor elements 75B and 76B provide shorter paths in the processor function, and allow each processor 70A and 70B to be constructed using elements from different planes of processors in the 3-D framework. This effectively decreases the planar geometry of each processor and removes dead cycles from the execution flow as the path from the output of one execution element (on one plane) to the input of the execution element (on another plane) is much faster. These principles can be applied to other aligned components of the execution units, such as arithmetic units, etc., as well as other processor elements such as the L2 an L3 caches, as will be explained in further detail below.

In other exemplary embodiments of the invention as depicted in FIG. 8, each of the processors 70A and 70B can be used independently of each other, wherein the vertical connections between the processor units across the processor layers would not be used to aggregate or share resources. For example, in one operating mode, both processors 70A or 70B can run (typically on unrelated programs) at reduced power (e.g., half power) so that the total power is substantially the same as it would be if only one processor 70A or 70B was operated at one time at full power. In another mode of operation, one of the processors 70A or 70B can be turned off and the other can be operated in a high-speed mode (or turbo mode) at twice the power, for example.

In another exemplary embodiment of the invention, in an enhanced "Turbo" mode of operation, one of processors 70A or 70B can be disabled (inactive), and the other can be operated in a high-speed mode (or turbo mode) at twice the power, but wherein certain elements of the execution unit of the inactive processor can be used by the active processor thereby enhancing its execution capabilities. For example, in the exemplary embodiment of FIG. 8, the second processor 70B (primary processor) can be turned on and running with increased power in a high-speed turbo mode, while the first processor 70A can be turned off, but wherein the micro-architecture of the second (active) processor 70B is augmented by using elements of the first (inactive) processor 70A By way of specific example, the floating point units 75A and 76A and registers 77A of the first (inactive) processor 70A can be utilized by the execution unit 73B of the second (active) processor 70B while operating in enhanced turbo mode so the second processor 70B can operate at increased speed with four floating-point units 75A, 75B, 76A, 76B and additional registers 77A. This augmented architecture allows the second processor 70B to run code that is more powerful faster and more efficiently. With this framework, the mode control scheme can be configured so that a given processor can be turned off, while allowing one or more components of the inactive processor to be selectively powered on and off by coupling or decoupling power lines to the desired components of the inactive processor.

In another exemplary embodiment of the invention, different caches in different layers of processor chips can be conjoined using vertical connections so that the processors can operate caches at any particular level in the cache hierarchy as a single shared cache. For example if two stacked processors have their L2 caches aligned and their L3 caches aligned, then the aligned pair of L2 caches can be operated as a single shared L2 cache having twice the capacity, and the aligned pair of L3 caches can be operated as a single shared L3 having twice the capacity. These principles will now be explained in further detail with reference to FIGS. 9A, 9B and 9C.

Figure 9A:
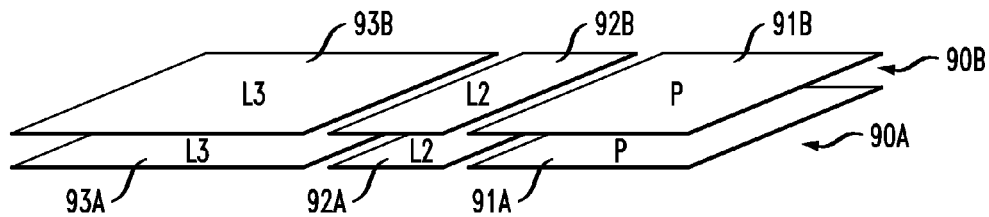
FIG. 9A is a schematic perspective view of a 3-D stacked multiprocessor device comprising first and second processors vertically stacked on top of each other having aligned L2 and L3 caches, according to an exemplary embodiment of the invention.

FIG. 9A is a schematic perspective view of a 3-D stacked multiprocessor device 90 comprising a first processor 90A and a second processor 90B vertically stacked on top of the first processor 90A. In the exemplary embodiment of FIG. 9A, the processors 90A and 90B are identical in structure, and have respective processor cores 91A and 91B, L2 caches 92A and 92B, and L3 caches 93A and 93B. As depicted in FIG. 9A, the L2 caches 92A and 92B are aligned and have the same footprint (2D area). Moreover, the L3 caches 93A and 93B are aligned and have the same footprint. In this 3-D stacked framework, the aligned L2 caches 92A and 92B can be vertically connected and operated as a single shared L2 cache. Moreover, the aligned L3 caches 93A and 93B can be vertically connected and operated as a single shared L3 cache.

Figure 9B:
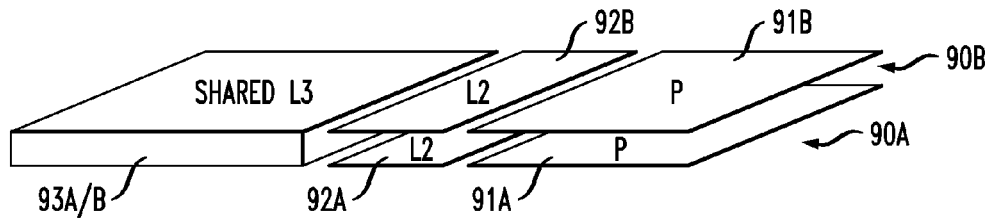
FIG. 9B is a schematic perspective view of the 3-D stacked multiprocessor device of FIG. 9A having the L3 caches conjoined for operation as a shared L3 cache by the first and second processors, according to an exemplary embodiment of the invention.
Figure 9C:
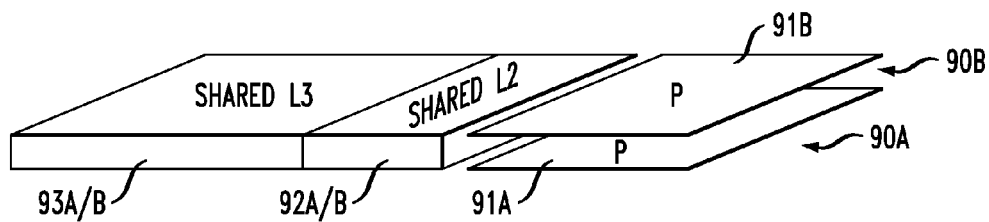
FIG. 9C is a schematic perspective view of the 3-D stacked multiprocessor device of FIG. 9A having the L3 caches as well as L2 caches conjoined for operation as a shared L2 cache and shared L3 cache by the first and second processors, according to an exemplary embodiment of the invention.

For instance, FIG. 9B is a schematic perspective view of the 3-D stacked multiprocessor device 90 of FIG. 9A, wherein the L3 caches 93A and 93B are conjoined and can operated by one or both of the processors 90A and 90B as a shared L3 cache 93A/B. Similarly, FIG. 9C is a schematic perspective view of the 3-D stacked multiprocessor device 90 of FIG. 9A, wherein the L2 caches 92A and 92B are also conjoined and can be operated by one or both of the processors 90A and 90B as a shared L2 cache 92A/B. In particular, in one exemplary embodiment wherein the L2 and L3 caches of the processors 90A and 90B are vertically connected together, the L2 and L3 caches can be used in two alternative modes—either as independent caches wherein the connections between them across layers are not used, or shared across the layers thereby enhancing the cache capacity of all the processors in the layers.

An advantage to a 3-D stacked cache framework is that the storage capacity of the caches is doubled without increasing the cache access time. Indeed, the speed of access to a cache is generally known to be proportional to the square root of the cache area. In the exemplary embodiments shown in FIGS. 9B and 9C, vertically connecting the aligned L2 and L3 caches does not increase the cache area as the footprints of the corresponding L2 and L3 caches are spatially coincident. In this regard, since area of the conjoined L2 caches 92A/B and the area of the conjoined L3 caches 93A/B does not increase by virtue of the vertical connections, the cache access speed remains the same. In order to enable access to the same cache address space for the processors 90A and 90B running different programs, cache control schemes can be readily implemented to control and organize the shared cached directory and to maintain cache coherence between the various cache layers.

In another exemplary embodiment of the invention, 3-D stacked processor device can be constructed to include a plurality of processors that are conjoinable to increase a number of threads that are supposed by a single processor image within the 3-D stack of processors. For example, in a 3-D stacked processor device comprising a first processor chip having a first processor, and a second processor chip having a second processor, both the first and second processor chips can be active, wherein the first and second processors are configured to operate as a single processor and aggregate their threads to increase an amount of threads that are usable by the first and second processors. This allows the multithreading capability of a single processor within the 3-D stacked to be effectively increased without requiring overhead (threads) associated with having to employ additional threads on the single processor itself. These principles will now be explained in further with reference to FIGS. 10 and 11.

FIG. 10 is a schematic perspective view of a 3-D stacked processor device 100 comprising a first processor 100A and a second processor 100B vertically stacked on top of the first processor 100A. In the exemplary embodiment of FIG. 10, the first and second processors 100A and 100B are multithreaded processors, and have identical processors and resister sets. In particular, the first processor 100A comprises four sets of registers 101A, 102A, 103A and 104A to implement four threads. Similarly, the second processor 100B comprises four sets of registers 101B, 102B, 103B and 104B to implement four threads.

In the exemplary embodiment of FIG. 10, by vertically aligning and connecting the processors 100A and 100B, the 3-D processor stack can be operated in aggregation as a single multithreaded processor having correspondingly more threads. For example, in the example of FIG. 10, the four threads 101A, 101B, 102A, 102B, 103A, 103B, 104A and 104B of the two processors 100A and 100B can be run jointly so that the 3-D processor stack 100 appears to be a single processor running eight threads. Independently, for system-level arbitration in 3-D, when two or more processors are aligned, that set of processors will appear as a single node in the system's arbitration scheme. In this way, an arbitration "tree" as discussed below, for example, does not grow in complexity when additional processors are added in new stacked planes.

For a conventional planar system, processors can be fabricated with an increasing number of independent register sets to implement more threads that can be concurrently operated to increase the processing capability for multiple programs. However, as the number of threads per processor increases, the planar dimensions of the processor increases, resulting in cycle delays in communications between the resister sets and processor execution units, as well as increased power. With a 3-D stacked architecture such as shown in FIG. 10, the processors can be simplified with less register sets to support fewer threads per processor, while aggregating the thread between processor layers, as needed to increase the overall number of threads that a given layer can utilize. For instance, assuming most workloads for a given application operate with four or fewer threads, the processors 100A and 100B as shown in FIG. 10 can be optimized as four-thread processors. If a given workload requires more than four threads (up to 8 threads) to be executed, then the processors 100A and 100B within the 3-D processor stack 100 could be combined and operated as a single processor having eight threads.

In the exemplary embodiment of FIG. 10, control schemes and communication path are implemented to support the aggregation of threads across the different layers and to connect the caches between the layers and maintain cache coherence. These control schemes are communication path are designed so that each of the processors will see the same state when the threads in different layers actually share their address spaces. These concepts are schematically shown in FIG. 11.

Figure 11:
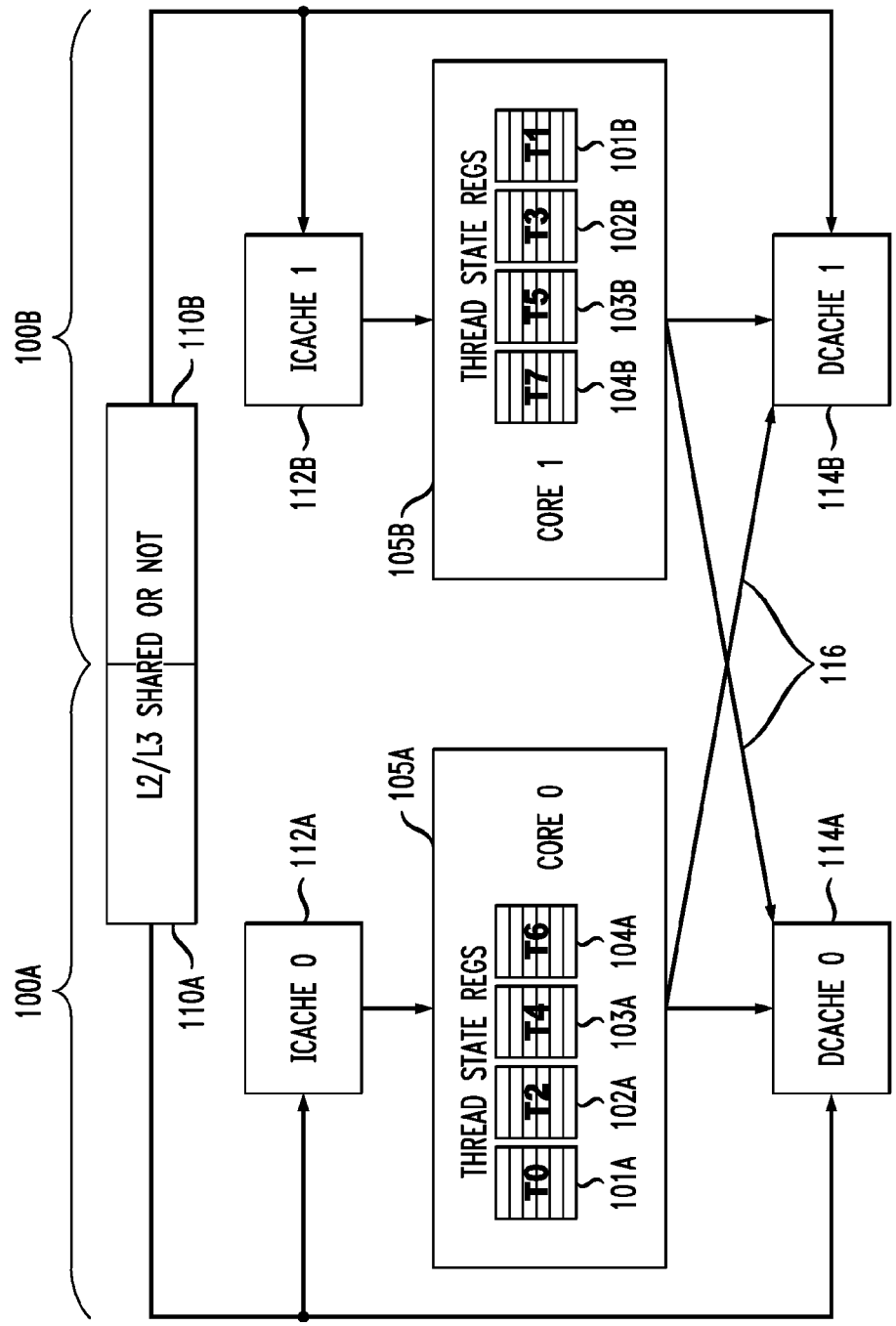
FIG. 11 schematically illustrates communication paths between various components of the processors shown in FIG. 10, according to an exemplary embodiment of the invention.

In particular, FIG. 11 schematically illustrates communication paths between various components of the processors shown in FIG. 10, according to an exemplary embodiment of the invention. As depicted in FIG. 11, the first processor 100A comprises a plurality register sets 101A, 102A, 103A and 104A (also denoted T0, T2, T4 and T6, respectively) that are associated with a first processor unit 105A, an L2 and L3 cache 110A, an instruction cache 112A, and a data cache 114A. Similarly, the second processor 100B comprises a plurality register sets 101B, 102B, 103B and 104B (also denoted T1, T3, T5 and T7, respectively) that are associated with a second processor unit 105B, an L2 and L3 cache 110B, an instruction cache 112B, and a data cache 114B.

The instruction caches 112A and 112B and data caches 114A and 114B receive program instructions and data that are stored in the respective L2 or L3 caches 110A and/or 110B. The L2 and/or L3 caches 110A and/or 110B can be conjoined and shared as discussed above with reference to FIG. 9C, for example. The program instructions that are stored in the instruction caches 112A and 112B are executed by respective processors 105A and 105B for one or more threads, and the execution state for a given thread is stored in a respective one of the thread state registers T0, T1, T2, T3, T4, T5, T6, T7. As data is generated from execution of the program instructions, the processor 105A stores data in its data cache 114A and the processor 105B stores data in its respective data cache 114B. In accordance with principles of the present invention, additional communication paths 116 across the layers between the processors 105A and 105B and the data caches 114A and 114B are utilized to facilitate consistent stores. This communication path 116 can be implemented processor-on-processor, because the ports are spatially collocated when the processors are aligned.

Although the exemplary embodiments of FIGS. 10 and 11 illustrate processors each having register sets to support 4 operating threads, principles of the invention can be readily extended to each processor having n threads, wherein if each processor is n-way multithreaded, the processor pair can be run as a 2n-way multithreaded processor, as seen by the rest of the system. Again, with this implementation, it is particularly useful when running n threads most of the time (where each processor is not heavily threaded) and thereby allowing the basic processor to be optimized for n-thread operation, but having the capability to extend the system to run $2n$ threads when needed.

As noted above, when two or more processors are aligned in a 3-D stacked configuration, the processors will appear as a single node in the system's arbitration scheme. With this framework, an arbitration "tree" (or more generally, processor interconnect structure) can be constructed so that does not grow in complexity when additional processors are added in new stacked planes. Exemplary processor interconnect structures according to principles of the invention will now be discussed in further detail with reference to FIGS. 12, 13, 14, 15, and 16.

Figure 12:
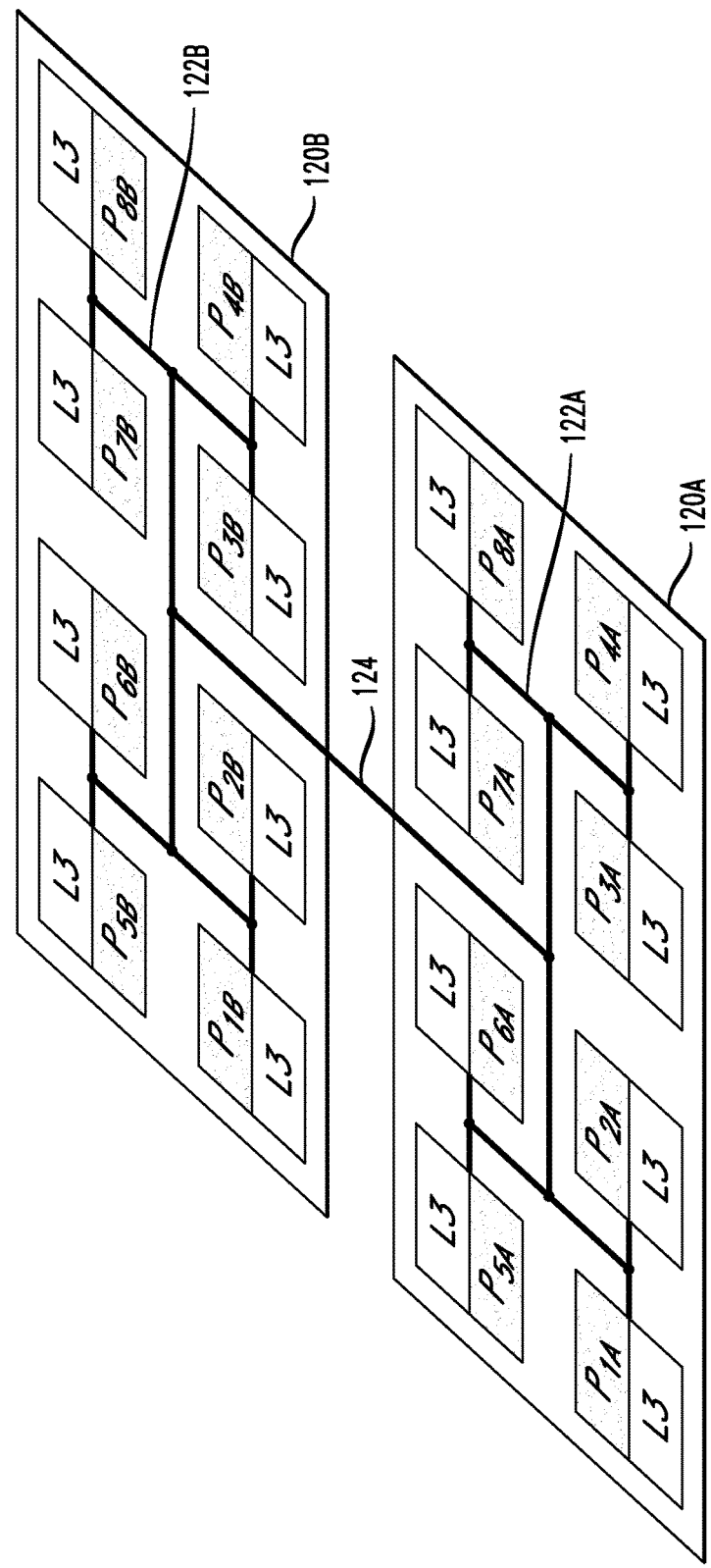
FIG. 12 schematically illustrates a processor interconnect structure for a planar processor system.

FIG. 12 schematically illustrates a processor interconnect scheme for a planar processor system. In particular, FIG. 12 illustrates a planar processor system 120 comprising a first processor 120A and a second processor 120B that are disposed on the same plane. The first processor 120A includes a plurality of processors P1A, P2A, P3A, P4A, PSA, P6A, P7A and P8A (collectively, PnA) and respective L3 caches. The processors PnA of the first processor 120A communicate over a processor interconnect structure 122A. Similarly, the second processor 120B includes a plurality of processors P1B, P2B, P3B, P4B, PSB, P6B, P7B and P8B (collectively, PnB) and respective L3 caches. The processors PnB of the second processor 120A communicate over a processor interconnect structure 122B. In the example embodiment of FIG. 12, the processor interconnect structures 122A and 122B are depicted as "tree" structures that implement a standard arbitration scheme.

Figure 13:
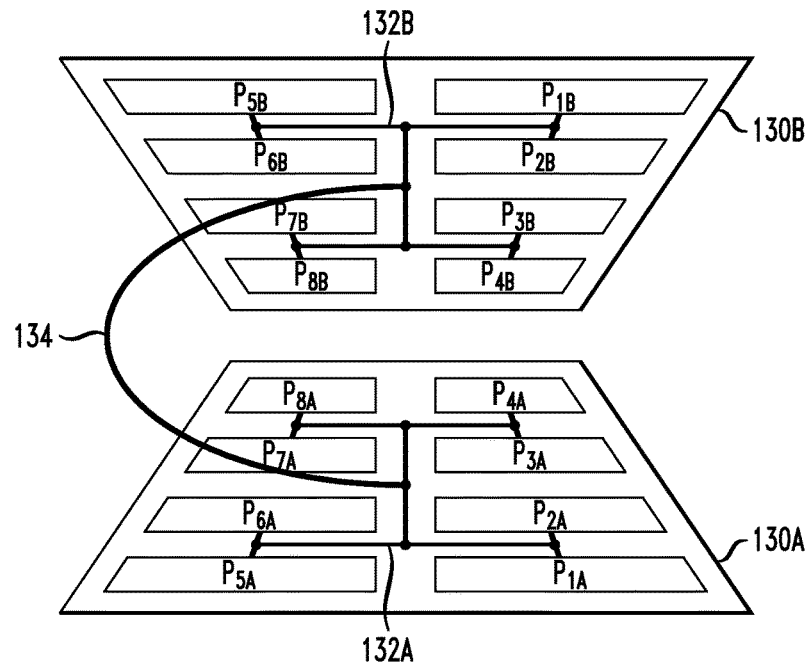
FIG. 13 schematically illustrates a processor interconnect structure for a 3-D stacked multiprocessor system according to an exemplary embodiment of the invention.

Further, as depicted in FIG. 12, the communication busses 122A and 122B are interconnected using an bus interconnect structure 124. In the planar system 120 of FIG. 12, this bus interconnect structure 124 is relatively long in the 2D plane. Accordingly, to principles of the invention, this processor interconnect structure can be more simplified in a 3-D stacked framework, such as depicted in FIG. 13. In particular, FIG. 13 schematically illustrates a processor interconnect scheme for a 3-D stacked multiprocessor system according to an exemplary embodiment of the invention. In particular, FIG. 13 illustrates a planar processor system 130 comprising a first processor 130A and a second processor 130B which is disposed on top of the first processor 130A. The first processor 130A includes a plurality of processors P1A, P2A, . . . , P8A (collectively, PnA), which are interconnected and communicate using a processor interconnect structure 132A. Similarly, the second processor 130B includes a plurality of processors P1B, P2B, . . . , P8B (collectively, PnB), which are interconnected and communicate using a processor interconnect structure 132B. The processor interconnect structures 132A and 132B are depicted as "tree" structures that implement a standard arbitration scheme.

As further depicted in FIG. 13, the processor interconnect structures 132A and 132B are interconnected using a connecting bus structure 134. The overall processor interconnect scheme of FIG. 13 is similar in concept to the overall processor interconnect scheme of FIG. 12 except that the bus connecting structure 134 (which connects the processor interconnect structures 132A and 132B) is formed using vertical connections between the stacked processor chips 130A and 130B. In this regard, the vertical connecting bus structure 134 is much shorter in length than the planar connecting bus structure 124 depicted in FIG. 12. As such, the overall processor interconnect scheme in FIG. 13 is effectively smaller and faster than the overall processor interconnect scheme depicted in FIG. 12.

Figure 14:
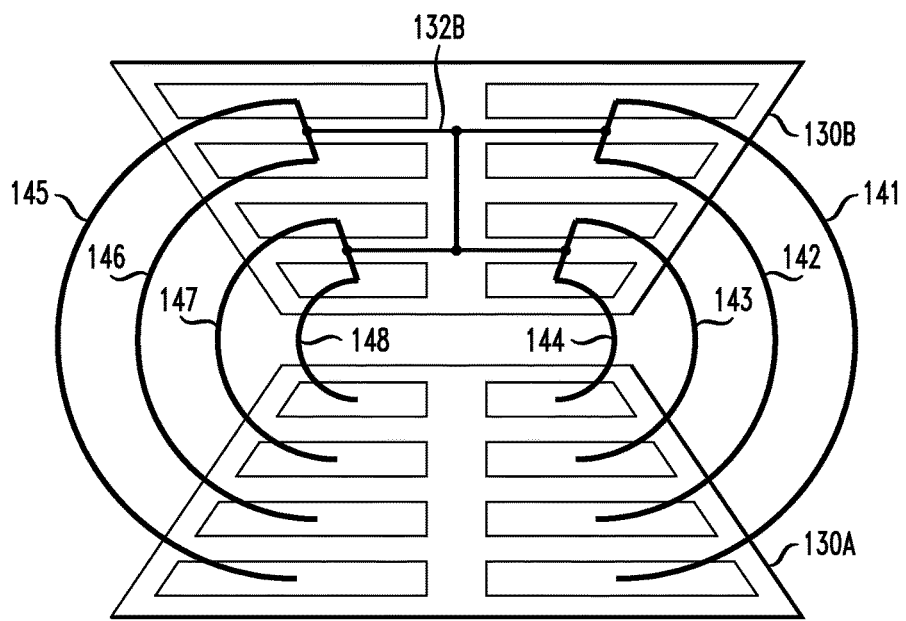
FIG. 14 schematically illustrates a processor interconnect structure for a 3-D stacked multiprocessor system according to another exemplary embodiment of the invention.

FIG. 14 schematically illustrates a processor interconnect scheme for a 3-D stacked multiprocessor system according to another exemplary embodiment of the invention. FIG. 14 schematically illustrates a 3-D stacked processor structure 140 having a processor interconnect framework that is topologically equivalent to the processor interconnect framework of the 3-D stacked processor of FIG. 13, but faster and more simplified in terms of size. More specifically, as shown in FIG. 14, a processor interconnect scheme is implemented using a tree structure 132B on the second processor chip 130B and a plurality of vertical bus connections 141, 142, 143, 144, 145, 146, 147 and 148, which extend from endpoints of the tree buss structure 132B on the second processor chip 130B to respective processors on the first processor chip 130A. The processor interconnect scheme of FIG. 14 takes into consideration that the processors on the first and second processor chips 130A and 130B are aligned to each other, such that the terminal end points of the tree bus structures 132A and 132B of the first and second processor chips 130A and 130B (see FIG. 13) are also aligned. With this vertical alignment, the vertical bus connections 141, 142, 143, 144, 145, 146, 147 and 148 (as shown in FIG. 14) can be implemented in place of the single vertical bus interconnect 134 (as shown in FIG. 13). Indeed, since each terminal point of the bus tree structure 132B on the upper processor chip 130B is aligned to the terminal point of the bus tree structure 132A on the lower processor chip 130A, the terminal points of the two tree structures 132A and 132B can be connected using short vertical connections, which then allows one of the tree structures 132A and 132B to be disregarded and not used. These principles are further discussed and illustrated with reference now to FIG. 15.

Figure 15:
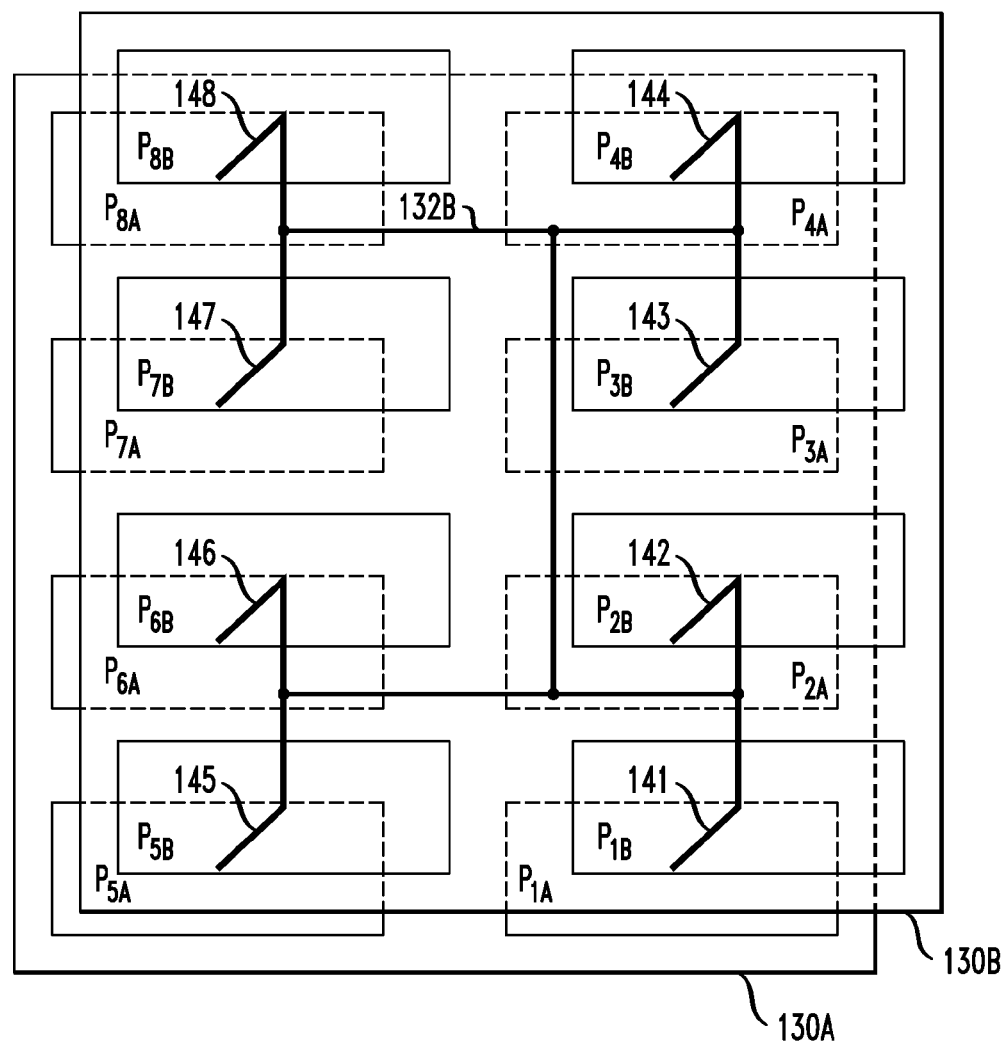
FIG. 15 is a schematic top perspective view of a 3-D stacked multiprocessor system according to an exemplary embodiment of the invention having a processor interconnect structure that is based on the processor interconnect structure of FIG. 14.

In particular, FIG. 15 is a schematic top perspective view of a 3-D stacked multiprocessor system according to an exemplary embodiment of the invention having a processor interconnect structure that is based on the processor interconnect structure scheme of FIG. 14. FIG. 15 illustrates a 3-D stacked multiprocessor system 150 that is a physical implementation of the conceptual system shown in FIG. 14, wherein the processors PnA on the lower processor chip 130A and processors PnB on the upper processor chip 130B are aligned with the terminal end points of the bus tree structure 132B. This allows the bus tree structure 132B to be connected to pairs of processors P1A/P1B, P2A/P2B, P3A/P3B, P4A/P4B, P5A/P5B, P6A/P6B, P7A/P7B, and P8A/P8B at each end point terminal of the buss tree structure 123B using short vertical conductive via connections 141, 142, 143, 144, 145, 146, 147 and 148, respectively. Because these vertical conducive via interconnects are relatively short, each upper/lower pair of processors can be treated as a single vertical drop on the global bus 132B. Again, the use of the vertical vias 141, 142, . . . , 148 provide shorter communication paths between aligned processors, as compared to the single vertical buss connect structure 134 shown in FIG. 13.

Figure 16:
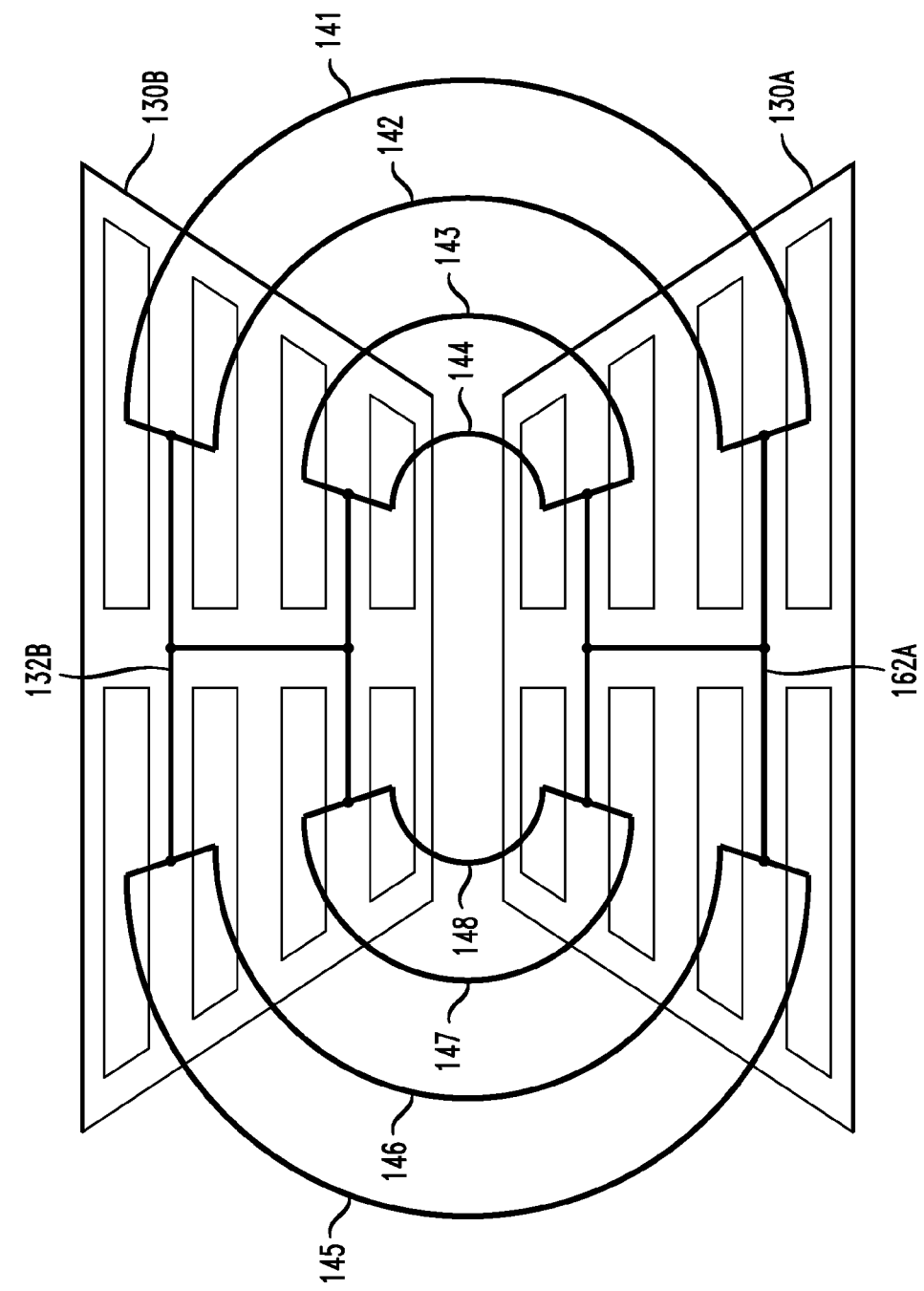
FIG. 16 schematically illustrates a processor interconnect structure for a 3-D stacked multiprocessor system according to yet another exemplary embodiment of the invention.

FIG. 16 schematically illustrates a processor interconnect structure for a 3-D stacked multiprocessor system according to yet another exemplary embodiment of the invention. FIG. 16 schematically illustrates a 3-D stacked processor structure 160 having a bus framework that is similar to that of FIG. 14, except for the inclusion and use of an additional tree structure 162A on the lower processor chip 130A. The additional tree structure 162A can be used to shorten the communication path between in-plane processors and augment communication bandwidth. In particular, in the exemplary embodiment of FIG. 16, the tree structure 162A can be used for processor-to-processor communication between processors PnA on the first processor chip 130A without having to use the short vertical buss interconnects 141, 142, . . . , 148 or the upper tree structure 132B. Similarly, the tree structure 132B can be used for processor-to-processor communication between processors PnB on the second processor chip 130B without having to use the short vertical buss interconnects 141, 142, . . . , 148 or the lower buss tree structure 162A.

In another control scheme, both tree structures 162A and 132B can be used concurrently in conjunction with the short vertical interconnects 141, 142, ..., 148 to provide two independent communication paths between any two processors so that 2× increase in communication bandwidth may be realized. Indeed, assume that each tree structure 132B and 162A is a 16-byte bus, which requires 16 cycles to communicate 256 bytes of information between processors. In this embodiment, the communication bandwidth can be increased to 32 bytes by concurrently using two separate communication paths between any two processors to send 32 bytes (16 bytes per path) at same time, thereby increasing communication bandwidth to 512 bytes of information for 16 cycles.

In another exemplary embodiment of the invention, a 3-D stacked multiprocessor device can be constructed to include a plurality of processors that are conjoinable and configured as a single hyper-fast processor by selectively combining the fastest components of each vertically stacked processor. With advanced technology, there can be considerable variation in device performance between identical processors, wherein some subsystems of one processor may be faster than the same subsystems of another identical processor, while at the same time, the relationship could be the opposite for different subsystems. Indeed, based on variations of device dimensions and shapes, and doping variations, etc., a set of identical processors that are formed on given wafer, having identical layout and macro functional components, can have faster or slower components than the same components of another identical processor.

In this regard, in accordance with another exemplary embodiment of the invention, when two processors (a first and second processor) on different layers of processor chips have an identical layout of subsystem regions, in one mode of operation, the first and second processors can be configured to operate as a single processor by combining faster ones of corresponding subsystem regions of the first and second processors and by turning off slower ones of corresponding subsystem regions of the first and second processors. These principles will now be illustrated and discussed in further detail with reference to FIGS. 17A and 17B.

Figure 17B:
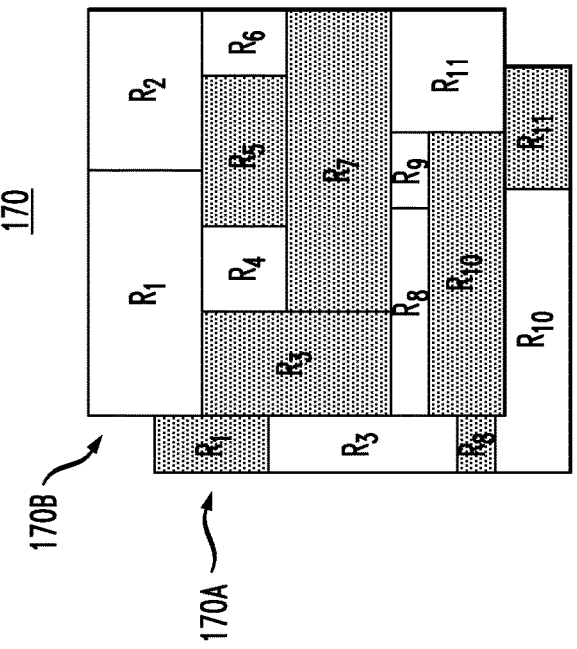
FIG. 17B schematically illustrates a 3-D stacked processor structure that is formed by vertically stacking the two processors shown in FIG. 17A, and operated as a single processor that is composed of the fastest of the corresponding regions of each processor, according to an exemplary embodiment of the invention.
Figure 17A:
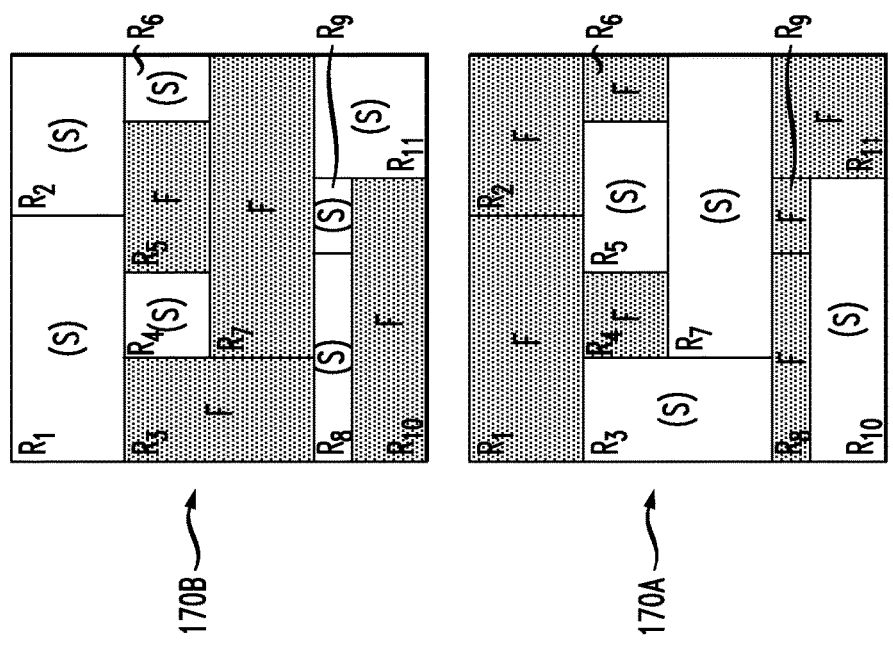
FIG. 17A schematically illustrates two processors having identical layouts according to an exemplary embodiment of the invention, wherein corresponding regions of the two identical processors are identified as being faster or slower than its counterpart region.

In particular, FIG. 17A schematically illustrates two processors having identical layouts according to an exemplary embodiment of the invention, wherein corresponding regions of the two identical processors are identified as being faster or slower than its counterpart region. In particular, FIG. 17A illustrates two identical processors 170A and 170 having eleven identical major regions (macros) R1, R2, R3, R4, R5, R6, R7, R8, R9 and R11. After fabrication, these regions of the processor are tested for speed because while the processors are the same, some regions of a given will be faster/slower than the same region of another identical processor. In the exemplary embodiment of FIG. 17A, regions R1, R2, R4, R6, R8, R9 and R11 of the first processor 170A are identified as being faster (labeled "F") than the same regions on the identical processor 170B. Moreover, regions R2, R5, R7, and R10 of the second processor 170B are identified as being faster (labeled "F") than the same regions on the identical processor 170A.

FIG. 17B a schematic view of a 3-D stacked multiprocessor system 170 according to an exemplary embodiment of the invention which includes the processors 170A and 170B of FIG. 17A. In particular, FIG. 17B schematically illustrates a 3-D stacked processor structure that is formed by vertically stacking the two processors shown in FIG. 17A, and operated as a single processor that is composed of the fastest of the corresponding regions of each processor, according to an exemplary embodiment of the invention. In FIG. 17, the processors are aligned and vertically connected such that corresponding regions R1, R2, ..., R11 are aligned and connected to each other. The caches and execution resources of the two processors 170A and 170B are vertically connected so that the 3-D stacked processor system 170 can be operated in one of a plurality of modes.

For instance, in one mode, the processors 170A and 170B can be operated as independent processors wherein each processor is active and operating at half power, as discussed above. In another exemplary embodiment, one of the processors 170A or 170B can be operated at full power or enhanced power (Turbo Mode), while the other processor is turned off. In yet another embodiment, the processors 170A and 170B can be operated as a single processor that includes those regions from each processor that are identified as being the fastest version of that region, so that the resulting processor can operate as a single ultrafast processor with a speed that is faster than if using all the components from just one processor layer. For instance, in the exemplary embodiment of FIG. 17B, the 3-D stacked processor structure 170 can be operated as a single processor comprising 11 regions consisting of the fast regions R1, R2, R4, R6, R8, R9 and R11 of the first processor 170A and the fast regions R2, R5, R7, and R10 of the second processor 170B.

In another exemplary embodiment of the invention, a 3-D stacked multiprocessor device can have a plurality of conjoined processors that operate logically as a single processor image, but wherein at least one processor is utilized for a "run-ahead" functionality. In particular, by way of example, in a 3-D stacked multiprocessor device having first and second stacked processors that are aligned and vertically connected to each other, the first processor can be a primary processor that is responsible for the architected state of the machine, and the secondary processor can run ahead of the primary processor to resolve branches and generate misses early, while the secondary processor is unconstrained by the architecture or program and unable to change the architected state of the machine.

In this exemplary embodiment, the caches and execution resources of the first and second processors are connected together so they can be used, for example, in two alternative modes—either as independent processors wherein the connections between the processor layer are not used, or in a collaborative manner, wherein the primary processor executes programs and the secondary processor runs a simpler version of the programs so that the secondary processor can advance ahead of the primary processor generating memory requests and resolving branches whose outcome can be used by the primary processor to avoid long-latency memory accesses and branch mispredictions, among other options. This concept of implementing a run-ahead or assist-thread in a 3-D stacked processor system will be described in further detail with reference to FIG. 18.

Figure 18:
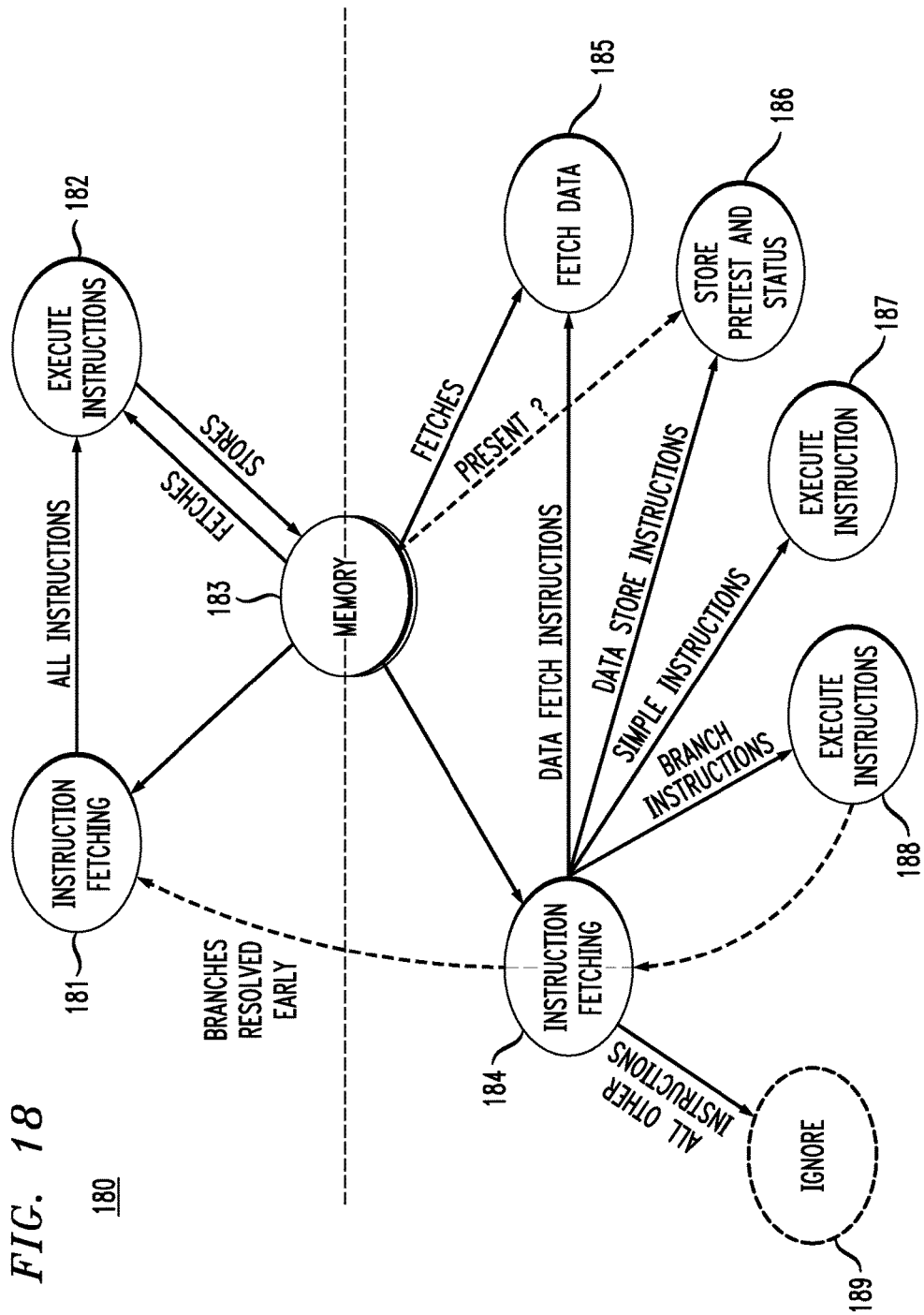
FIG. 18 schematically illustrates a method for implementing run-ahead functionality in a 3-D stacked processor system, according to an exemplary embodiment of the invention.

In particular, FIG. 18 schematically illustrates a method for implementing run-ahead functionality in a 3-D stacked processor system according to an exemplary embodiment of the invention. In particular, FIG. 18 illustrates a plurality of operations 181 and 182 that are performed by a primary processor operating a main thread with regard to a memory that is shared between the primary and a secondary processor, and a plurality of operations 184, 185, 186, 187, 188 and 189 that are performed by the secondary processor operating as run-ahead thread in collaboration with the primary processor.

In particular, as shown in FIG. 18, when executing a program in the 3-D stacked processor system, the primary processor fetches instructions 181 from memory 183 and executes every program instruction 182. While executing instructions, the primary processor will fetch and store program data from the shared memory 183 and maintain the state of the machine (storage) that is visible to all outside entities. In other words, the primary processor executes the program correctly in that the primary processor performs the instruction operations in the correct order, and only manifests state change information to the rest of the system when those changes are known to be correct. However, to make the program execution faster, with higher instruction-level parallelism, the secondary processor operates as a "run-ahead processor, wherein the secondary processor does not guarantee correct and legal operation, and does not manifest state changes to the rest of the system. Instead, it runs as fast as possible in a speculative manner, and not bothering with instructions that have nothing to do with the program flow. By operating in this manner, the run-ahead processor will resolve many of the branches and generate many necessary cache misses earlier than the primary processor would be able to. This will allow the primary processor to run faster than it normally would.

In particular, as shown in FIG. 18, the secondary processor will fetch instructions 184 from the shared memory 183 and execute certain instructions, such as data fetch instructions, and fetch data 185 from the shared memory 183 in response to the data fetch instructions. The secondary processor will execute data store instructions and perforin a memory access operation 186 to determine if necessary data is stored in memory 183. The secondary processor will execute simple instructions 187 and execute branch instructions 188, and discard or otherwise ignore all other fetched instructions 189 that have no relation to determining caches misses or resolving branch redirections. In step 186, when the secondary processor sees a data store instruction coming up, the secondary processor will determine if a cache line exists for the data to be stored. If a cache line does not exist, the secondary processor will generate a cache miss and proceed to have a cache line allocated for the data store and obtain the proper permissions to store the data in the newly allocated cache line (i.e., make sure the status of the new cache line is in a "data store ready" state). If the cache line does already exist, the secondary processor will determine if the cache line is in a "data store ready" state, and proceed to obtain the proper permissions if not. In this manner, when the primary processor executes the data store instruction, the cache line will be available and in "store ready" status, thereby avoiding a cache miss in the execution flow.

The secondary processor (run-ahead processor) accelerates the primary processor by resolving contingencies before the primary processor sees them. The secondary processor can operate in this matter as it does not have to execute every instruction, and does not have to perform program operations correctly. In the 3-D stacked configuration, since the primary and secondary processors are spatially coincident and connected by short vertical connections, they are able to share and view the execution state, and otherwise synchronize more readily and robustly than in a coplanar configuration, where long wires would be needed to exchange the proper synchronization information. Even with coplanar wiring between coplanar processors, the coplanar processors would likely not be able to view each other's states coincidentally. In a 3-D stacked configuration, communications and interactions between the assist thread and main thread to share values and otherwise synchronize process flow, are more readily realizable through short vertical connections between the resources of the primary and secondary processors.

In another exemplary embodiment of the invention, a 3-D stacked multiprocessor device can have a plurality of conjoined processors which operate logically as a single processor image, but wherein at portions of their Architected Storage operate as a Private Storage Space (or scratchpad space) that is not accessible to processor outside the 3-D stack. In other words, multiple processors can be conjoined into a single operating entity (a "processor" as seen from the outside) having an area of private storage that can be used for scratchpad space, and to organize other data structures, wherein the private storage is not visible to the other operating entities in the system. When a tuple of processors is run as a single logical processor in either run ahead mode or Hyper turbo mode, or any other tupling, one or more of the caches of the tuple can be used as private storage with an application-specific structure.

Although exemplary embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. A system, comprising:
   a computer processor comprising:
      a first processor chip comprising a first processor; and
      a second processor chip comprising a second processor;
      wherein the first and second processor chips are vertically aligned and connected in a stacked configuration with the first and second processors connected through vertical connections between the first and second processor chips, and wherein the first and second processors have an identical layout of corresponding subsystem regions; and
   a control system configured to generate different sets of configuration parameters to operate the computer processor in different operating modes;
   wherein the control system is configured to generate a first control signal to selectively input a first set of the configuration parameters to the first and second processors;
   wherein the first and second processors utilize the first set of the configuration parameters to configure the first and second processors to operate in a first mode of operation in which the first and second processors operate as a single processor by combining subsystem regions of the first and second processors having faster operating speeds and by turning off subsystem regions of the first and second processors having slower operating speeds;
   wherein the control system is configured to generate a second control signal to selectively input a second set of the configuration parameters to the first and second processors; and
   wherein the first and second processors utilize the second set of the configuration parameters to configure the first and second processors to operate in a second mode of operation in which both the first and second processors operate independently without aggregating or sharing resources of the first and second processors.

2. The system of claim 1, wherein the control system is configured to generate a third control signal to selectively input a third set of the configuration parameters to the first and second processors; and
   wherein the first and second processors utilize the third set of the configuration parameters to configure the first and second processors to operate in a third mode of operation in which the first and second processors are both active, wherein a microarchitecture of the first processor of the first processor chip is configured by aggregating elements from both the first and second processors, and wherein a microarchitecture of the second processor of the second processor chip is configured by aggregating elements from both the first and second processors.

3. The system of claim 2, wherein the aggregated elements comprise portions of execution units of the first and second processors.

4. The system of claim 2, wherein the aggregated elements comprise caches.

5. The system of claim 4, wherein an aggregated cache comprises caches of the first and second processors, which are vertically connected and logically operated as a shared cache between the first and second processors.

6. The system of claim 2, wherein the aggregated elements comprise register sets.

7. The system of claim 1, wherein the control system is configured to generate a third control signal to selectively input a third set of the configuration parameters to the first and second processors; and
wherein the first and second processors utilize the third set of the configuration parameters to configure the first and second processors to operate in a third mode of operation in which the first processor chip is active and the second processor chip is inactive, and wherein a microarchitecture of the first processor of the active first processor chip is augmented by utilizing a portion of the second processor of the inactive second processor chip.

8. The system of claim 7, wherein the microarchitecture of the first processor is augmented by utilizing a portion of an execution unit of the second processor of the inactive second processor chip.

9. The system of claim 7, wherein the microarchitecture of the first processor is augmented by combining a cache of the first processor with a cache of the second processor of the inactive second processor chip.

10. The system of claim 7, wherein the first processor of the active first processor chip operates at increased power in a turbo mode while utilizing said portion of the second processor of the inactive second processor chip.

11. The system of claim 1, wherein the control system is configured to generate a third control signal to selectively input a third set of the configuration parameters to the first and second processors; and
wherein the first and second processors utilize the third set of the configuration parameters to configure the first and second processors to operate in a third mode of operation in which both the first and second processor chips share a processor interconnect structure.

12. The system of claim 1, wherein the control system is configured to generate a third control signal to selectively input a third set of the configuration parameters to the first and second processors; and
wherein the first and second processors utilize the third set of the configuration parameters to configure the first and second processors to operate in a third mode of operation in which the first and second processor chips are both active, and wherein the first and second processors are configured to operate as a single processor and aggregate their threads to increase an amount of threads that are usable by the first and second processors.

13. The system of claim 1, wherein the first and second processor chips are multiprocessor chips each having n corresponding processors which are vertically aligned to each other, wherein the first processor chip comprise a first processor interconnect structure that interconnects each of the n processors of the first processor chip together, wherein each processor of the first processor chip is connected to the first processor interconnect structure, and wherein each corresponding aligned processor on the second processor chip is connected to the first processor interconnect structure using vertical connections between the first and second processor chips.

14. The system of claim 13, wherein each set of vertically aligned processors between the first and second processor chips logically appears as a single node in an arbitration control scheme of the computer processor.

15. The system of claim 13, wherein the second processor chip comprises a second processor interconnect structure that connects each of the ii processors of the second processor chip together, wherein the combination of the first and second processor interconnect structures provides at least two independent communication paths between any two processors of the first and second processor chips.

16. A semiconductor package, comprising;
a package substrate; and
a processor system comprising a plurality of 3-D stacked processor chips mounted on the package substrate, wherein each 3-D stacked processor chip comprises:
a second processor chip comprising a second processor;
wherein the first and second processor chips are vertically aligned and connected in a stacked configuration with the first and second processors connected through vertical connections between the first and second processor chips, and wherein the first and second processors have an identical layout of corresponding subsystem regions; and
a control system configured to generate different sets of configuration parameters to operate the computer processor in different operating modes;
wherein the control system is configured to generate a first control signal to selectively input a first set of the configuration parameters to the first and second processors;
wherein the first and second processors utilize the first set of the configuration parameters to configure the first and second processors to operate in a first mode of operation in which the first and second processors operate as a single processor by combining subsystem regions of the first and second processors having faster operating speeds and by turning off subsystem regions of the first and second processors having slower operating speeds;
wherein the control system is configured to generate a second control signal to selectively input a second set of the configuration parameters to the first and second processors; and
wherein the first and second processors utilize the second set of the configuration parameters to configure the first and second processors to operate in a second mode of operation in which both the first and second processors operate independently without aggregating or sharing resources of the first and second processors.

* * * * *